US009082826B2

(12) United States Patent
Chandrashekar et al.

(10) Patent No.: US 9,082,826 B2
(45) Date of Patent: Jul. 14, 2015

(54) METHODS AND APPARATUSES FOR VOID-FREE TUNGSTEN FILL IN THREE-DIMENSIONAL SEMICONDUCTOR FEATURES

(71) Applicant: Lam Research Corporation, Fremont, CA (US)

(72) Inventors: Anand Chandrashekar, Sunnyvale, CA (US); Joydeep Guha, Danville, CA (US); Raashina Humayun, Fremont, CA (US); Hua Xiang, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/285,505

(22) Filed: May 22, 2014

(65) Prior Publication Data
US 2014/0349477 A1    Nov. 27, 2014

Related U.S. Application Data

(60) Provisional application No. 61/827,511, filed on May 24, 2013.

(51) Int. Cl.
*H01L 21/44* (2006.01)
*H01L 21/311* (2006.01)
(Continued)

(52) U.S. Cl.
CPC .... *H01L 21/76877* (2013.01); *H01L 21/32136* (2013.01); *H01L 21/67069* (2013.01); *H01L 21/67207* (2013.01); *H01L 21/76841* (2013.01)

(58) Field of Classification Search
USPC .......................................... 438/675, 685, 696
See application file for complete search history.

(56) References Cited

U.S. PATENT DOCUMENTS 4,714,520 A * 12/1987 Gwozdz ........................ 438/699
4,804,560 A    2/1989 Shioya et al.
(Continued)

FOREIGN PATENT DOCUMENTS

EP    1 055 746    11/2000
JP    H04-56130    2/1992
(Continued)

OTHER PUBLICATIONS

US Notice of Allowance dated Mar. 18, 2015 issued in U.S. Appl. No. 14/285,505.
(Continued)

*Primary Examiner* — Karen Kusumakar
(74) *Attorney, Agent, or Firm* — Weaver Austin Villeneuve & Sampson LLP

(57) ABSTRACT

Disclosed herein are methods of filling a 3-D structure of a semiconductor substrate with a tungsten-containing material. The 3-D structure may include sidewalls, a plurality of openings in the sidewalls leading to a plurality of features having a plurality of interior regions. The methods may include depositing a first layer of the tungsten-containing material within the 3-D structure such that the first layer partially fills a plurality of interior regions of the 3-D structure, etching vertically and horizontally after depositing the first layer, and depositing a second layer of the tungsten-containing material within the 3-D structure after the vertical and horizontal etching such that the second layer fills at least a portion of the interior regions left unfilled by the first layer. Also disclosed herein are apparatuses for filling a 3-D structure of a semiconductor substrate with a tungsten-containing material having a controller with instructions for etching vertically and horizontally.

27 Claims, 12 Drawing Sheets

(51) Int. Cl.
*H01L 21/768* (2006.01)
*H01L 21/67* (2006.01)
*H01L 21/3213* (2006.01)

(56) References Cited

U.S. PATENT DOCUMENTS

| | | |
|---|---|---|
| 5,037,775 A | 8/1991 | Reisman |
| 5,164,330 A | 11/1992 | Davis et al. |
| 5,489,552 A | 2/1996 | Merchant et al. |
| 5,719,410 A | 2/1998 | Suehiro et al. |
| 5,747,379 A | 5/1998 | Huang et al. |
| 5,767,015 A | 6/1998 | Tabara |
| 5,807,786 A | 9/1998 | Chang |
| 5,866,483 A | 2/1999 | Shiau et al. |
| 6,011,311 A | 1/2000 | Hsing et al. |
| 6,100,193 A | 8/2000 | Suehiro et al. |
| 6,110,822 A | 8/2000 | Huang et al. |
| 6,184,158 B1 | 2/2001 | Shufflebotham et al. |
| 6,221,754 B1 | 4/2001 | Chiou et al. |
| 6,245,654 B1 | 6/2001 | Shih et al. |
| 6,376,376 B1 | 4/2002 | Lim et al. |
| 6,383,910 B2 | 5/2002 | Okada et al. |
| 6,432,830 B1 | 8/2002 | Merry |
| 6,593,233 B1 | 7/2003 | Miyazaki et al. |
| 6,635,965 B1 | 10/2003 | Lee et al. |
| 6,683,000 B2 * | 1/2004 | Fukui et al. ......... 438/672 |
| 6,696,337 B2 | 2/2004 | Asano et al. |
| 6,844,258 B1 | 1/2005 | Fair et al. |
| 7,005,372 B2 | 2/2006 | Levy et al. |
| 7,141,494 B2 | 11/2006 | Lee et al. |
| 7,193,369 B2 | 3/2007 | Min et al. |
| 7,578,944 B2 | 8/2009 | Min et al. |
| 7,589,017 B2 | 9/2009 | Chan et al. |
| 7,655,567 B1 | 2/2010 | Gao et al. |
| 7,772,114 B2 | 8/2010 | Chan et al. |
| 7,955,972 B2 | 6/2011 | Chan et al. |
| 7,993,460 B2 | 8/2011 | Steger |
| 8,058,170 B2 | 11/2011 | Chandrashekar et al. |
| 8,071,478 B2 | 12/2011 | Wu et al. |
| 8,119,527 B1 | 2/2012 | Chadrashekar et al. |
| 8,124,531 B2 | 2/2012 | Chandrashekar et al. |
| 8,129,270 B1 | 3/2012 | Chandrashekar et al. |
| 8,153,520 B1 | 4/2012 | Chandrashekar et al. |
| 8,435,894 B2 | 5/2013 | Chandrashekar et al. |
| 8,501,620 B2 | 8/2013 | Chandrashekar et al. |
| 8,551,885 B2 | 10/2013 | Chen et al. |
| 8,835,317 B2 | 9/2014 | Chandrashekar et al. |
| 2002/0132472 A1 | 9/2002 | Park |
| 2002/0177325 A1 | 11/2002 | Takewaka et al. |
| 2003/0017701 A1 | 1/2003 | Nakahara et al. |
| 2003/0082902 A1 | 5/2003 | Fukui et al. |
| 2003/0190802 A1 | 10/2003 | Wang et al. |
| 2004/0025091 A1 | 2/2004 | Totman et al. |
| 2004/0077161 A1 | 4/2004 | Chen et al. |
| 2004/0079632 A1 | 4/2004 | Ahmad et al. |
| 2004/0245091 A1 | 12/2004 | Karim et al. |
| 2005/0031786 A1 | 2/2005 | Lee et al. |
| 2005/0179141 A1 | 8/2005 | Yun et al. |
| 2005/0250316 A1 | 11/2005 | Choi et al. |
| 2005/0275941 A1 | 12/2005 | Liu et al. |
| 2006/0075966 A1 | 4/2006 | Chen et al. |
| 2006/0084269 A1 | 4/2006 | Min et al. |
| 2006/0094238 A1 | 5/2006 | Levy et al. |
| 2006/0214244 A1 | 9/2006 | Minakata |
| 2007/0187362 A1 | 8/2007 | Nakagawa et al. |
| 2008/0254623 A1 | 10/2008 | Chan et al. |
| 2009/0053893 A1 | 2/2009 | Khandelwal et al. |
| 2010/0072623 A1 | 3/2010 | Prindle et al. |
| 2010/0130002 A1 | 5/2010 | Dao et al. |
| 2010/0144140 A1 | 6/2010 | Chandrashekar et al. |
| 2010/0240212 A1 | 9/2010 | Takahashi |
| 2011/0159690 A1 * | 6/2011 | Chandrashekar et al. .... 438/675 |
| 2011/0233778 A1 | 9/2011 | Lee et al. |
| 2012/0009785 A1 | 1/2012 | Chandrashekar et al. |
| 2012/0115329 A1 | 5/2012 | Chandrashekar et al. |
| 2012/0164832 A1 | 6/2012 | Chandrashekar et al. |
| 2013/0062677 A1 | 3/2013 | Li et al. |
| 2013/0171822 A1 | 7/2013 | Chandrashekar et al. |
| 2013/0302980 A1 | 11/2013 | Chandrashekar et al. |
| 2013/0330926 A1 | 12/2013 | Chandrashekar et al. |
| 2014/0017891 A1 | 1/2014 | Chandrashekar et al. |
| 2014/0349477 A1 | 11/2014 | Chandrashekar et al. |
| 2015/0024592 A1 | 1/2015 | Chandrashekar et al. |
| 2015/0056803 A1 | 2/2015 | Chandrashekar et al. |

FOREIGN PATENT DOCUMENTS

| | | |
|---|---|---|
| JP | H07-094488 | 4/1995 |
| JP | H07-226393 | 8/1995 |
| JP | H09-326436 | 12/1997 |
| JP | H10-178014 A | 6/1998 |
| JP | 2001-007048 | 1/2001 |
| JP | 2001-274114 | 10/2001 |
| JP | 2002-009017 | 1/2002 |
| JP | 2002-305162 | 10/2002 |
| JP | 2003-007677 | 1/2003 |
| JP | 2003-142484 | 5/2003 |
| JP | 2006-278496 | 10/2006 |
| JP | 2007-251164 | 9/2007 |
| JP | 2010-225697 | 10/2010 |
| KR | 10-2003-0035877 | 5/2003 |
| KR | 10-2003-0058853 | 7/2003 |
| KR | 10-2004-0087406 | 10/2004 |
| KR | 10-2005-0011479 | 1/2005 |
| KR | 10-2005-0013187 | 2/2005 |
| KR | 10-2006-0087844 | 8/2006 |
| KR | 10-2010-0067065 | 6/2010 |
| KR | 1201074 | 11/2012 |
| TW | 557503 | 10/2003 |
| WO | WO 2013/148444 | 10/2013 |
| WO | WO 2013/148880 | 10/2013 |

OTHER PUBLICATIONS

US Office Action dated Dec. 30, 2009 issued in U.S. Appl. No. 12/332,017.
US Final Office Action dated Jul. 26, 2010 issued in U.S. Appl. No. 12/332,017.
US Office Action dated Nov. 15, 2010 issued in U.S. Appl. No. 12/332,017.
US Final Office Action dated Jul. 22, 2011 issued in U.S. Appl. No. 12/332,017.
US Notice of Allowance dated Oct. 28, 2011 issued in U.S. Appl. No. 12/332,017.
US Office Action dated Nov. 1, 2010 issued in U.S. Appl. No. 12/535,377.
US Office Action dated Jun. 14, 2011 issued in U.S. Appl. No. 12/535,377.
US Final Office Action dated Dec. 1, 2011 issued in U.S. Appl. No. 12/535,377.
US Office Action dated Mar. 7, 2013 issued in U.S. Appl. No. 12/535,377.
US Final Office Action dated Oct. 7, 2013 issued in U.S. Appl. No. 12/535,377.
US Examiner's Answer to Appeal Brief dated Apr. 17, 2015 issued in U.S. Appl. No. 12/535,377.
US Office Action dated Nov. 23, 2012 issued in U.S. Appl. No. 13/412,534.
US Notice of Allowance dated Apr. 8, 2013, issued in U.S. Appl. No. 13/412,534.
US Office Action dated Apr. 11, 2014 issued in U.S. Appl. No. 13/934,089.
US Office Action dated Nov. 12, 2014 issued in U.S. Appl. No. 13/934,089.
US Office Action dated Sep. 13, 2010 issued in U.S. Appl. No. 12/535,464.
US Final Office Action dated Apr. 14, 2011 issued in U.S. Appl. No. 12/535,464.
US Office Action dated Jul. 28, 2011 issued in U.S. Appl. No. 12/535,464.

(56) References Cited

OTHER PUBLICATIONS

US Office Action dated Oct. 12, 2011 issued in U.S. Appl. No. 12/535,464.
US Notice of Allowance dated Dec. 30, 2011 issued in U.S. Appl. No. 12/535,464.
US Office Action dated Sep. 2, 2011 issued in U.S. Appl. No. 12/534,566.
US Notice of Allowance dated Dec. 20, 2011 issued in U.S. Appl. No. 12/534,566.
US Office Action dated Mar. 13, 2012 issued in U.S. Appl. No. 12/833,823.
US Final Office Action dated Dec. 21, 2012 issued in U.S. Appl. No. 12/833,823.
US Office Action dated Sep. 9, 2013 issued in U.S. Appl. No. 12/833,823.
US Final Office Action dated Apr. 1, 2014 issued in U.S. Appl. No. 12/833,823.
US Notice of Allowance dated Jan. 14, 2015 issued in U.S. Appl. No. 12/833,823.
US Office Action dated Nov. 25, 2011 issued in U.S. Appl. No. 13/016,656.
US Notice of Allowance dated Jan. 9, 2012 issued in U.S. Appl. No. 13/016,656.
US Office Action dated Mar. 27, 2012 issued in U.S. Appl. No. 13/351,970.
US Final Office Action dated Sep. 11, 2012 issued in U.S. Appl. No. 13/351,970.
US Notice of Allowance dated Jan. 9, 2013 issued in U.S. Appl. No. 13/351,970.
US Office Action dated Jan. 6, 2014 issued in U.S. Appl. No. 13/888,077.
US Notice of Allowance, dated May 12, 2014 issued in U.S. Appl. No. 13/888,077.
US Office Action, dated Jan. 15, 2015, issued in U.S. Appl. No. 13/774,350.
US Office Action, dated Dec. 23, 2014, issued in U.S. Appl. No. 13/851,885.
US Office Action dated Dec. 18, 2014 issued in U.S. Appl. No. 14/502,817.
JP Office Action dated Mar. 11, 2014 issued in Japanese Application No. 2009-278990.
JP Final Office Action dated Mar. 17, 2015 issued in Japanese Application No. 2009-278990.
KR Office Action dated Aug. 8, 2011 issued in Korean Application No. 10-2009-0122292.
KR Office Action dated Jun. 26, 2012 issued in Korean Application No. 10-2009-0122292.
KR Office Action dated Nov. 6, 2012 issued in Korean Application No. 2012-0104518.
TW Office Action dated Mar. 27, 2014, issued in Taiwan Application No. 098142115.
TW Office Action (Decision) dated Oct. 13, 2014, issued in Taiwan Application No. 098142115.
JP Office Action dated Feb. 25, 2014 issued in Japanese Application No. 2009-292610.
JP Office Action dated Feb. 10, 2015 issued in Japanese Application No. 2009-292610.
KR Office Action dated Sep. 12, 2012 issued in Korean Application No. 2012-0104518.
TW Office Action dated Apr. 29, 2014, issued in Taiwan Application No. 098146010.
SG Examination and Search Report dated Dec. 14, 2011 issued in Singapore Application No. 201005237-1.
KR Provisional Rejection dated Nov. 16, 2012, issued in Korean Application No. 2011-0068603.
PCT International Search Report and Written Opinion, dated Jun. 28, 2013, issued in PCT/US2013/033174.
PCT International Preliminary Report on Patentability and Written Opinion, dated Oct. 9, 2014, issued in PCT/US2013/033174.
PCT International Search Report and Written Opinion, dated Jul. 26, 2013, issued in PCT/US2013/034167.
PCT International Preliminary Report on Patentability and Written Opinion, dated Oct. 9, 2014, issued in PCT/US2013/034167.
Chen et al., (Aug. 2003) "Advances in Remote Plasma Sources For Cleaning 300 mm and Flat Panel CVD Systems," *Semiconductor Magazine*, 6 pp.
Deposition Process, Oxford Electronics, 1996, 1 page.
Dimensions of Wafer as described by Wikepedia, 2008, 1 page.
Rosner et al., (1971) "Kinetics of the attack of refractory solids by atomic and molecular fluorine," *The Journal of Physical Chemistry*, 75(3):308-317.
Tsang, C.K. et al., "CMOS-Compatible Through Silicon Vias for 3D Process Integration", Materials Research Society 2007 Symposium Proceedings vol. 970, paper 0970-Y01-01.

\* cited by examiner

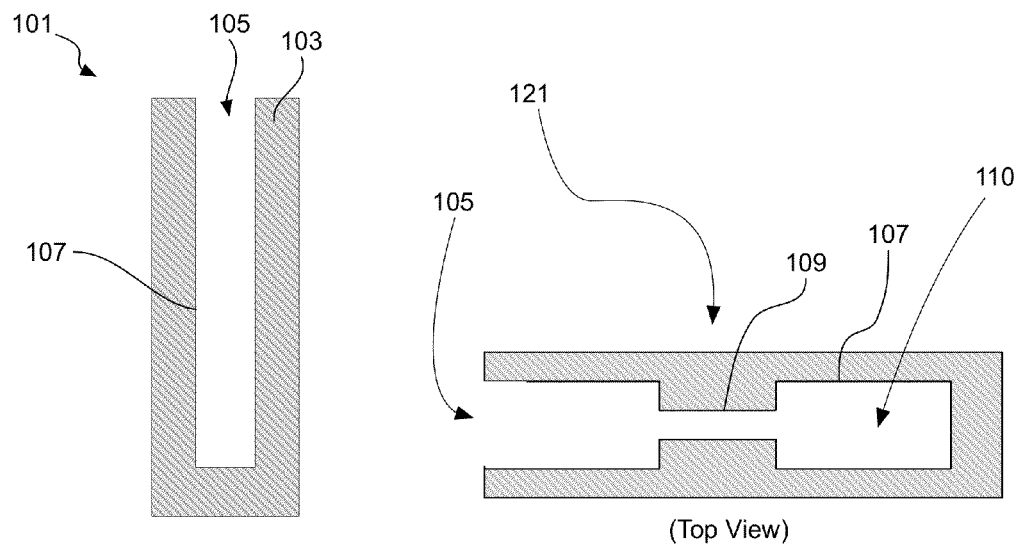
FIG. 1A
FIG. 1C
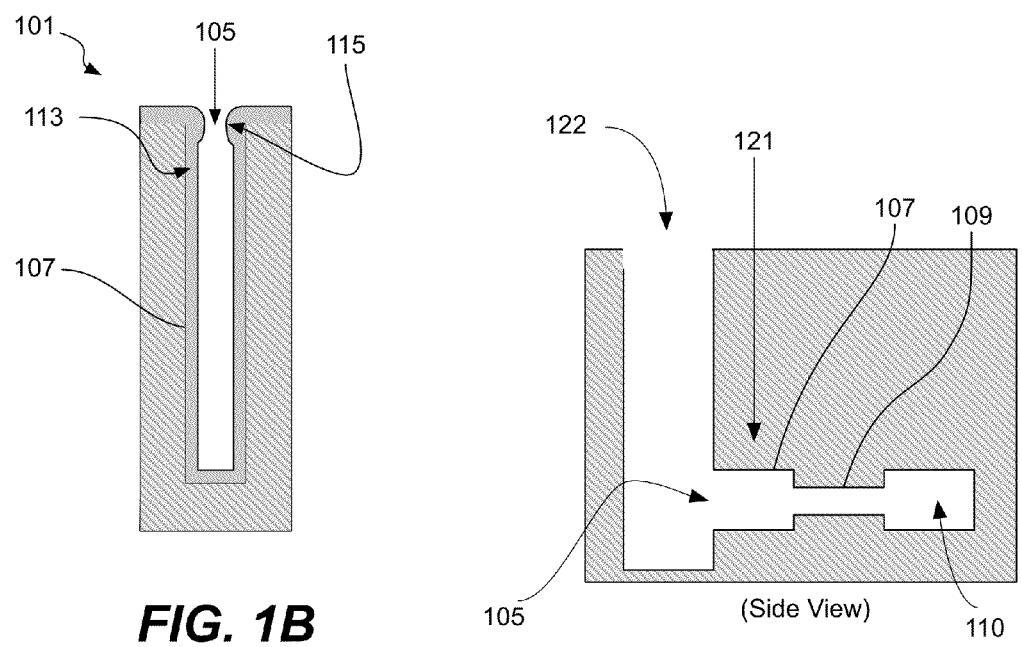
FIG. 1B
FIG. 1D

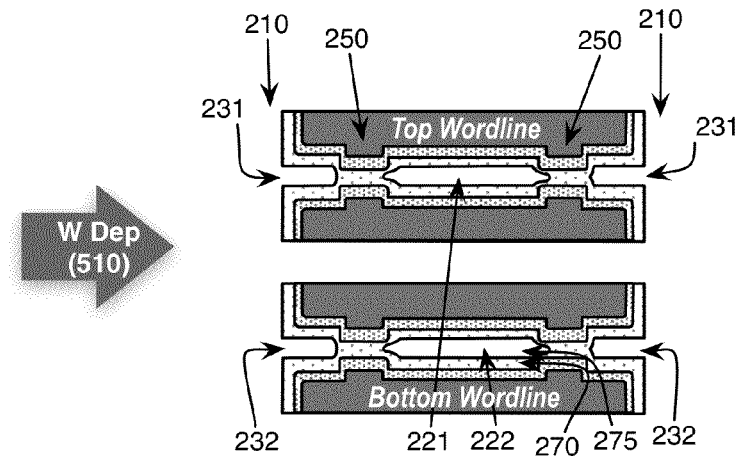
*FIG. 4A-1*
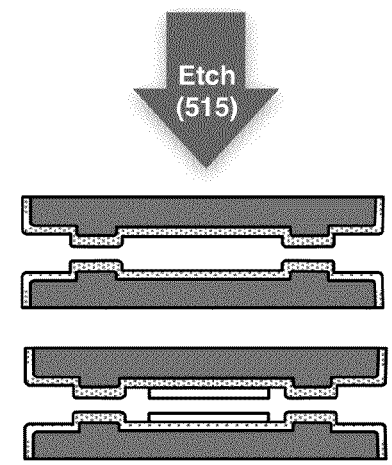
*FIG. 4A-2*
*FIG. 4A*
*FIG. 4A-3*

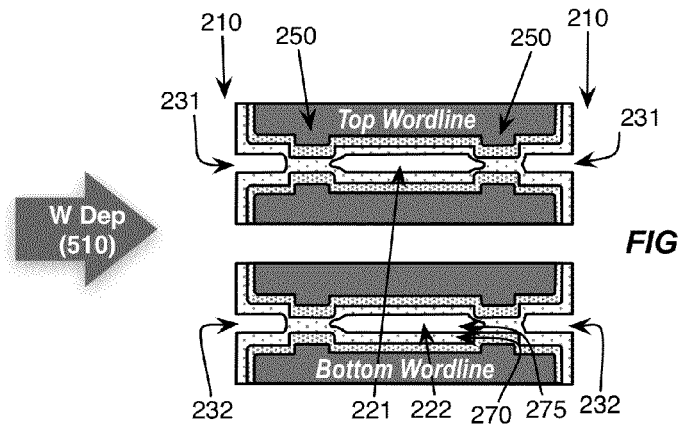
FIG. 4B-1
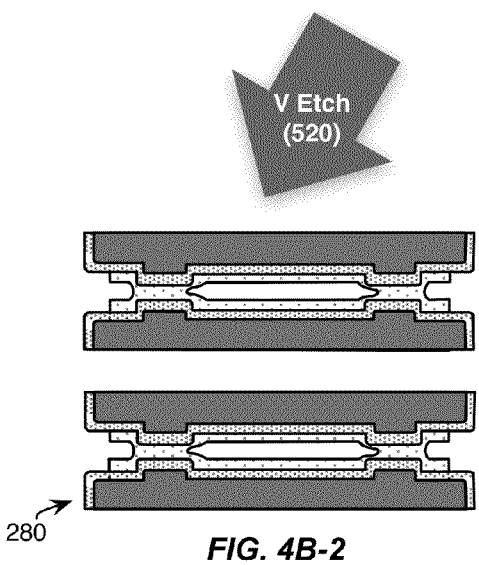
FIG. 4B-2
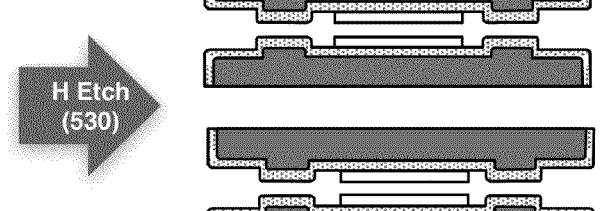
FIG. 4B-3
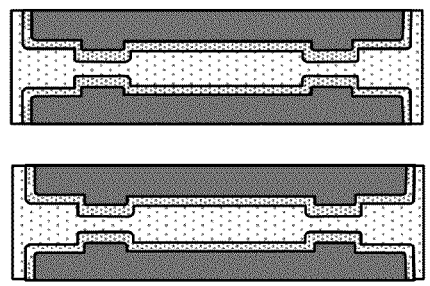
FIG. 4B-4
FIG. 4B

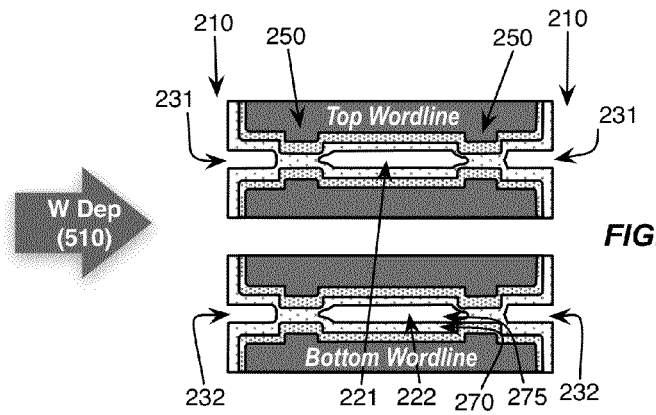
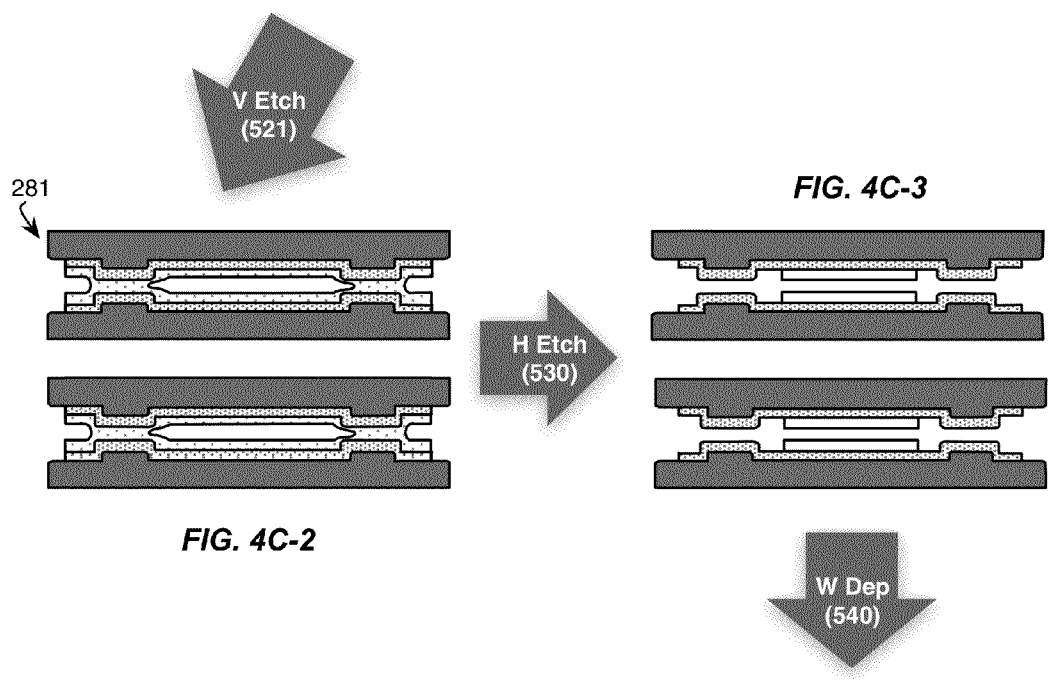
*FIG. 4C*
*FIG. 4C-1*
*FIG. 4C-2*
*FIG. 4C-3*
*FIG. 4C-4*

METHODS AND APPARATUSES FOR VOID-FREE TUNGSTEN FILL IN THREE-DIMENSIONAL SEMICONDUCTOR FEATURES

CROSS-REFERENCE TO RELATED APPLICATIONS

This application claims priority to U.S. Provisional Pat. App. No. 61/827,511, filed May 24, 2013, and titled "METHODS AND APPARATUSES FOR VOID-FREE TUNGSTEN FILL IN THREE-DIMENSIONAL SEMICONDUCTOR FEATURES," which is hereby incorporated by reference in its entirety for all purposes.

BACKGROUND

Deposition of tungsten and tungsten-containing materials is an integral part of many semiconductor fabrication processes. Such deposition may be accomplished via chemical vapor deposition (CVD) techniques, plasma-enhanced CVD (PECVD) techniques, atomic layer deposition (ALD) techniques, as well as other deposition techniques known in the IC fabrication arts such as, for example, physical vapor deposition (PVD). Tungsten and tungsten-containing materials, hereinafter referred to as tungsten-based materials or just tungsten materials, may be used for horizontal interconnects, vias between adjacent metal layers, contacts between first metal layers and devices on the silicon substrate, and may generally be used within various high aspect ratio features utilized in IC design.

In a conventional process for depositing tungsten material, a substrate is heated to a predetermined process temperature in a deposition chamber, and a thin layer of tungsten material is deposited to serve as a seed or nucleation layer. Thereafter, a bulk layer of tungsten material is deposited atop the nucleation layer. Conventionally, the tungsten material is formed by the reduction of tungsten hexafluoride ($WF_6$) with hydrogen ($H_2$). Typically, tungsten material is deposited over an entire exposed surface area of the substrate which often includes one or more field regions, as well as various IC features. These features may have widely varying aspect ratios, and in some embodiments, one or more or all features may have relatively high aspect ratios.

SUMMARY OF THE DISCLOSURE

Disclosed herein are methods of filling 3-D structures of a partially manufactured semiconductor substrates with a tungsten-containing material. In some embodiments, the 3-D structure comprising sidewalls, a plurality of openings in the sidewalls leading to a plurality of features having a plurality of interior regions fluidically accessible through the openings. The methods may include providing a substrate having the 3-D structure to a processing chamber, depositing a first layer of the tungsten-containing material within the 3-D structure such that the first layer partially fills the plurality of interior regions of the 3-D structure, and thereafter etching vertically and horizontally, and after the vertical and horizontal etching, depositing a second layer of the tungsten-containing material within the 3-D structure such that the second layer fills at least a portion of the interior regions left unfilled by the first layer. The vertical etching may include removing portions of the first layer of the tungsten-containing material from the sidewalls using a first activated etching material without substantially removing portions of the first layer from the plurality of interior regions, and the horizontal etching may include removing portions of the first layer of the tungsten-containing material from the plurality of interior regions using a second activated etching material.

In some embodiments, both of the depositing of the first and second layers of the tungsten-containing material include a reaction between a tungsten-containing precursor and a reducing agent. In some embodiments, the first activated etching material includes one or more ion species and the second activated etching material includes one or more neutral species, and in certain such embodiments, the second activated etching material may be generated from conversion of the first activated etching material within the 3-D structure. In some embodiments, the ion species making up the first activated etching material may be generated within the processing chamber through ionization of one or more of $NF_3$, $CF_4$, $CHF_3$, $CH_2F_2$, and $CH_3F$. In some embodiments, the first activated etching material may be a plasma which includes one or more ion species generated within the processing chamber. In some embodiments, the vertical etching includes applying an electromagnetic field to the ion species so that a portion of the ions are directed towards the base of the high aspect ratio feature. In some embodiments, the second activated etching material may be a plasma comprising one or more free radical species generated remotely from the processing chamber and introduced into the processing chamber. In certain such embodiments, the ion species and the free radical species may both contain fluorine.

Also disclosed herein are methods of filling a 3-D structure of a partially manufactured semiconductor substrate already having a first layer of a tungsten-containing material deposited. The 3-D structure may include sidewalls and a plurality of openings in the sidewalls leading to a plurality of features having a plurality of interior regions fluidically accessible through the openings. The first layer of the tungsten-containing material may at least partially cover the sidewalls and/or openings in the sidewalls, and partially fill the plurality of interior regions, but with a portion of the plurality of interior regions left unfilled by the first layer. The methods may include providing the substrate having the 3-D structure and etching vertically and horizontally. The vertical etching may remove portions of the first layer of the tungsten-containing material from the sidewalls and/or openings in the sidewalls without substantially removing portions of the first layer from the plurality of interior regions. The horizontal etching may remove portions of the first layer of the tungsten-containing material from the plurality of interior regions. In certain such embodiments, the methods may further include depositing a second layer of the tungsten-containing material after etching horizontally and vertically.

Also, disclosed herein are alternative methods of filling 3-D structures with a tungsten-containing material. In some embodiments, the methods include: providing a substrate having a 3-D structure, the 3-D structure including sidewalls, a plurality of openings to a plurality of features, the plurality of features having a plurality of interiors fluidically accessible through the plurality of openings; depositing a first layer of the tungsten-containing material within the structure via a reaction between a tungsten-containing precursor and a reducing agent, such that the first layer partially (or fully) fills the plurality of interiors; etching vertically after depositing the first layer of the tungsten-containing material; etching horizontally after the vertical etching; and depositing a second layer of the tungsten-containing material within the structure after the horizontal etching via a reaction between the tungsten-containing precursor and the reducing agent, such that the second layer fills at least part of the portion of the plurality of interiors left unfilled by the first layer.

In some embodiments, the vertical etching may include providing a first activated etching material; and removing portions of the first layer of the tungsten-containing material from the sidewalls of the 3-D structure using the first activated etching material without substantially removing portions of the first layer from the plurality of interiors of the plurality of features. In some embodiments, the horizontal etching may include: providing a second activated etching material; and removing portions of the first layer of the tungsten-containing material from the plurality of interiors using the second activated etching material. In some embodiments, at least portions of the exposed surfaces of the plurality of interiors are cleaned via a cleaning operation performed subsequent to the vertical etching but prior to the horizontal etching.

In some embodiments, the etch-rate corresponding to removal of portions of the first layer of the tungsten-containing material during the horizontal etching is substantially mass-transport limited. In some embodiments, the second layer of the tungsten-containing material is deposited within the plurality of interiors in a substantially void-free manner.

In some embodiments, the vertical etching of the material is done in a plasma chamber. In the plasma chamber the wafer is placed on an electrostatic chuck (ESC) that holds the wafer. Radio Frequency (RF) power is applied to ESC which generates a self-bias on the wafer in the presence of the plasma in the chamber. When the plasma is generated in the chamber, one or more chemical species of the feed gas (the gas fed to the chamber for plasma generation) are ionized, disassociated, etc. to generate reactive ions (e.g., $CHF^+$, $NF_2^+$, etc.) and/or reactive neutral species. Due to the self-bias on the wafer, ions in the plasma are accelerated towards the wafer. The energy of the ions striking the wafer can be controlled by the RF power applied to the ESC due to the acceleration of the ions with sufficient energy towards the wafer. Thus, in some embodiments, the first activated etching material may be a plasma which includes an ion species, and the vertical etching includes generating the plasma having the ion species within the processing chamber and applying an electromagnetic field to the ions so that a portion of the ions are directed towards the bottom of the high aspect ratio feature. In some embodiments, the second activated etching material may be a plasma that includes a free radical species, and etching horizontally includes generating the free radical species remote from the processing chamber and introducing the free radical species into the processing chamber. In some embodiments, the ion species includes fluorine-containing species; in some embodiments, the free radical species includes fluorine-containing species. For example, in some embodiments, the ion species includes ionized $NF_3$, $CF_4$, $SF_6$, or combinations thereof. In some embodiments, the free radical species includes fluorine radicals (F*). In other embodiments, methods of filling the 3-D structures of partially manufactured semiconductor substrates may include etching with a wet etchant. Examples of wet etchants that may be employed include combinations of $H_2O_2$, HF, $H_2SO_4$, $HNO_3$ and $NH_4OH$.

In some embodiments, at least a portion of the plurality of features of the 3-D structures are stacked in substantially vertical alignment with one another. For example, a 3-D structure may have 16 or more, or 64 or more, or 128 or more vertically stacked features in vertical alignment with one another.

In some embodiments, the substrate may further include an outer layer susceptible to tungsten deposition and upon which the first layer of tungsten-containing material may be deposited. In some embodiments, the vertical etching may remove the outer layer in at least portions of the sidewalls of the structure such that substantially no tungsten is deposited upon these portions during the subsequent deposition of the second layer of tungsten-containing material. In some embodiments, the outer layer susceptible to tungsten deposition includes a metal nitride such as titanium nitride. In some embodiments, the substrate having the 3-D structure may further include a plurality of pillars, e.g., polysilicon pillars, which partially inhibit the fluidic accessibility of the plurality of interiors through the plurality of openings. In some embodiments, the horizontal gap between the pillars is between about 1 and 20 nm.

In some embodiments, the vertical etching further includes: providing a polymer precursor; and forming a protective layer via polymerization of the polymer precursor over portions of the feature which attenuates the extent these portions are etched in lateral directions during the vertical etching. In some embodiments, the polymer precursor is a fluorine-containing compound. Examples of such polymer precursors include $CF_4$, $CHF_3$, $CH_2F_2$, and $CH_3F$.

In some embodiments, providing the first activated etching material involves flowing $NF_3$ into the processing chamber at a flow rate between about 300 sccm to 700 sccm; and providing the polymer precursor involves flowing the polymer precursor into the processing chamber at a flow rate between about 10 sccm to 50 sccm. In some embodiments, the vertical etching is performed in a processing chamber maintained at a temperature between about 10° C. and 120° C. and/or a pressure between about 5 mTorr and 100 mTorr while removing portions of the first layer of the tungsten-containing material. In some embodiments, the horizontal etching is performed in a processing chamber maintained at: a temperature between about 0 and 400° C.; and a pressure of between about 0.1 and 10 Torr while removing portions of the first layer of the tungsten-containing material. In some embodiments, during this operation, the pressure may be below about 5 Torr, or even below about 2 Torr. In some embodiments, during this operation, the temperature may be below about 250° C., or even below about 150° C. In some embodiments, during this operation, the temperature may be between about 50 and 400° C., or more particularly, between about 10 and 400° C.

In some embodiments, the plasma including the ion species used in the vertical etching is an inductively-coupled plasma generated and maintained by inductively-coupled RF power. The RF power may have a frequency between about 13 MHz and 60 MHz while also generated and maintained by substrate-biased RF power having a frequency between about 400 kHz and 14 MHz (such as about 13.56 MHz). In some embodiments, the substrate-biased RF power has a voltage between about 100 and 1000 Volts relative to the substrate, or more particularly a voltage between about 100 and 500 Volts relative to the substrate. In some embodiments, methods employing an inductively-coupled plasma may further include pulsing the substrate-biased RF power at a pulse rate between about 100 and 2000 Hz, or more particularly at a pulse rate between about 100 and 300 Hz, and with a duty cycle between about 10% and 90%, or more particularly with a duty cycle between about 10% and 60%. In some embodiments, the inductively-coupled RF power is between about 500 and 1900 Watts, or more particularly between about 500 and 600 Watts. In some embodiments, the inductively-coupled RF power is generated by generating coils including a first generating coil and a second generating coil, the first generating coil supplying inductively-coupled RF power to an inner region of the processing chamber, the second generating coil supplying inductively-coupled RF power to an outer region of the processing chamber, and wherein the total inductively-coupled RF power is split between the first and second generating coils in a ratio between about 0.1 and 1.5. In some embodiments, a plasma including free radical species used in the horizontal etching is generated and maintained by RF power.

In some embodiments, the vertical etching, the horizontal etching, and the operations of depositing the first and second layers of tungsten-containing material are performed in the same processing chamber. In some embodiments, one or more of the vertical and horizontal etching may be performed in a different processing chamber than the depositing of the first and second layers of tungsten-containing material.

Some methods disclosed herein for filling 3-D structures with a tungsten-containing material may further include etching vertically and horizontally after depositing the second layer of tungsten-containing material, and thereafter depositing a third layer of the tungsten-containing material within the structure after etching horizontally and vertically the second layer of tungsten-containing material. The depositing may be done via a reaction between the tungsten-containing precursor and the reducing agent, such that the third layer fills at least part of the portion of the plurality of interiors left unfilled by the first and second layers.

Also disclosed herein are one or more integrated tools for filling a 3-D structure of a partially manufactured semiconductor substrate with a tungsten material. In some embodiments, an integrated tool includes: one or more processing chambers; a substrate holder within each processing chamber configured to hold the substrate having the 3-D structure; one or more gas inlets configured to introduce a tungsten-containing precursor and a reducing agent into at least one of the one or more processing chambers; first and second power supplies configured to generate and maintain an inductively-coupled plasma within at least one of the one or more processing chambers, the first power supply supplying inductively-coupled RF power to the plasma, the second power supply supplying substrate-biased RF power to the plasma; a third power supply configured to generate and maintain a second plasma within a plasma-generating chamber remote from, but fluidically-coupled to, at least one of the one or more processing chambers; and a controller having instructions in the form of machine readable code, the controller configured to execute the instructions.

In some embodiments, the instructions include: instructions for operating the one or more gas inlets to introduce a flow of tungsten-containing precursor and a flow of reducing agent into at least one of the one or more processing chambers such that a layer of a tungsten-containing material is deposited within the 3-D structure via a chemical reaction between the tungsten-containing precursor and the reducing agent.

In some embodiments, the instructions include instructions for operating the first power supply at a frequency between about 13 MHz and 60 MHz generating between about 500 Watts and 1900 Watts of RF power. In some embodiments, the instructions include instructions for operating the second power supply at a frequency between about 400 kHz to 15 MHz (more particularly at 13.56 MHz) and at a voltage between about 100 to 1000 volts relative to the substrate with a pulse rate between about 100 and 2000 Hz and with a duty cycle between about 10% and 90%.

Also disclosed herein are methods of filling a 3-D structure including sidewalls, a plurality of openings in the sidewalls, and a plurality of interior regions fluidically accessible through the openings, with the methods including the following operations: depositing a first layer of a tungsten-containing material within the 3-D structure such that the first layer partially fills the plurality of structure interiors and leaves a portion of the structure interiors unfilled; etching vertically after depositing the first layer of the tungsten-containing material such that portions of the first layer are removed from the sidewalls using a first activated etching material without substantially removing portions of the first layer from the plurality of structure interiors; etching horizontally after depositing the first layer of the tungsten-containing material such that portions of the first layer of the tungsten-containing material are removed from the plurality of structure interiors using a second activated etching material; and depositing a second layer of the tungsten-containing material within the 3-D structure after etching horizontally and vertically such that the second layer fills at least a portion of the structure interiors left unfilled by the first layer. In some embodiments, the second activated etching material is generated from conversion of the first activated etching material within the 3-D structure.

Also disclosed herein are methods of filling a 3-D structure including sidewalls, a plurality of openings in the sidewalls, and a plurality of interior regions fluidically accessible through the openings, wherein the methods include: providing the substrate having the 3-D structure, the 3-D structure already having a first layer of a tungsten-containing material covering the sidewalls and/or structure openings of the 3-D structure and partially filling the plurality of interior regions of the 3-D structure but with a portion of the plurality of interior regions left unfilled by the first layer; etching vertically to uniformly remove portions of the first layer of the tungsten-containing material from the sidewalls and/or structure openings without substantially removing portions of the first layer from the plurality of structure interiors; and etching horizontally to remove portions of the first layer of the tungsten-containing material from the plurality of interior regions. In some embodiments, the vertical etching utilizes a first activated etching material and the horizontal etching utilizes a second activated etching material generated from conversion of the first activated etching material within the 3-D structure. In certain such embodiments, the first activated etching material comprises one or more charged species and the second activated etching material comprises one or more neutral species. Certain such methods may further include depositing a second layer of the tungsten-containing material after the vertical and horizontal etching.

Also disclosed herein are methods of filling a 3-D structure including sidewalls, a plurality of openings in the sidewalls, and a plurality of interior regions fluidically accessible through the openings, wherein the methods include: depositing a first layer of a tungsten-containing material in the 3-D structure; etch vertically after depositing the first layer by generating a plasma including an ion etch species and applying an electromagnetic field to the ions so that a portion of the ions are directed towards the bottom of the structure; etching horizontally after the vertical etching by generating a free radical species remote from the processing chamber holding the substrate having the 3-D structure and introducing the free radical species into the processing chamber; and depositing a second layer of the tungsten-containing material in the three-dimensional structure after the horizontal etching.

BRIEF DESCRIPTION OF THE DRAWINGS

FIG. 1A shows the cross-section of a vertical feature in a substrate which may be designed to be filled with tungsten material.

FIG. 1B shows an example of a similar feature to FIG. 1A, but having a re-entrant profile, due to the presence of an under-layer lining the bottom, sidewalls, and opening of the feature.

FIG. 1C illustrates a top-down plan view of a horizontal feature exhibiting a constriction roughly in the middle of its sidewall. In some embodiments, such horizontal features may be what are referred to as "wordlines" in a vertically integrated memory structure.

FIG. 1D illustrates a side-view of the same horizontal feature shown in FIG. 1C, but here shown having an opening to a vertical structure, and thus forming a part of vertical structure.

FIG. 4A-1 through 4A-3 schematically illustrate two wordlines at differing vertical depths within a vertical structure and their associated patterns of tungsten deposition at various stages during a sequence of tungsten deposition and etch steps.

FIG. 4B-1 through 4B-4 schematically illustrate two wordlines at differing vertical depths within a vertical structure and their associated patterns of tungsten deposition at various stages during a sequence of tungsten deposition and etch steps involving a horizontal etch and a vertical etch.

FIG. 4C-1 through 4C-4 schematically illustrate two wordlines at differing vertical depths within a vertical structure and their associated patterns of tungsten deposition at various stages during a sequence of tungsten deposition and etch steps involving a horizontal etch and a vertical etch similar to that shown in FIGS. 4B-1 through 4B-4 but wherein an activated etchant material is used to remove a thin layer of titanium nitride to prevent tungsten deposition on the sidewalls of the vertical structure.

DETAILED DESCRIPTION

Figure 2A:
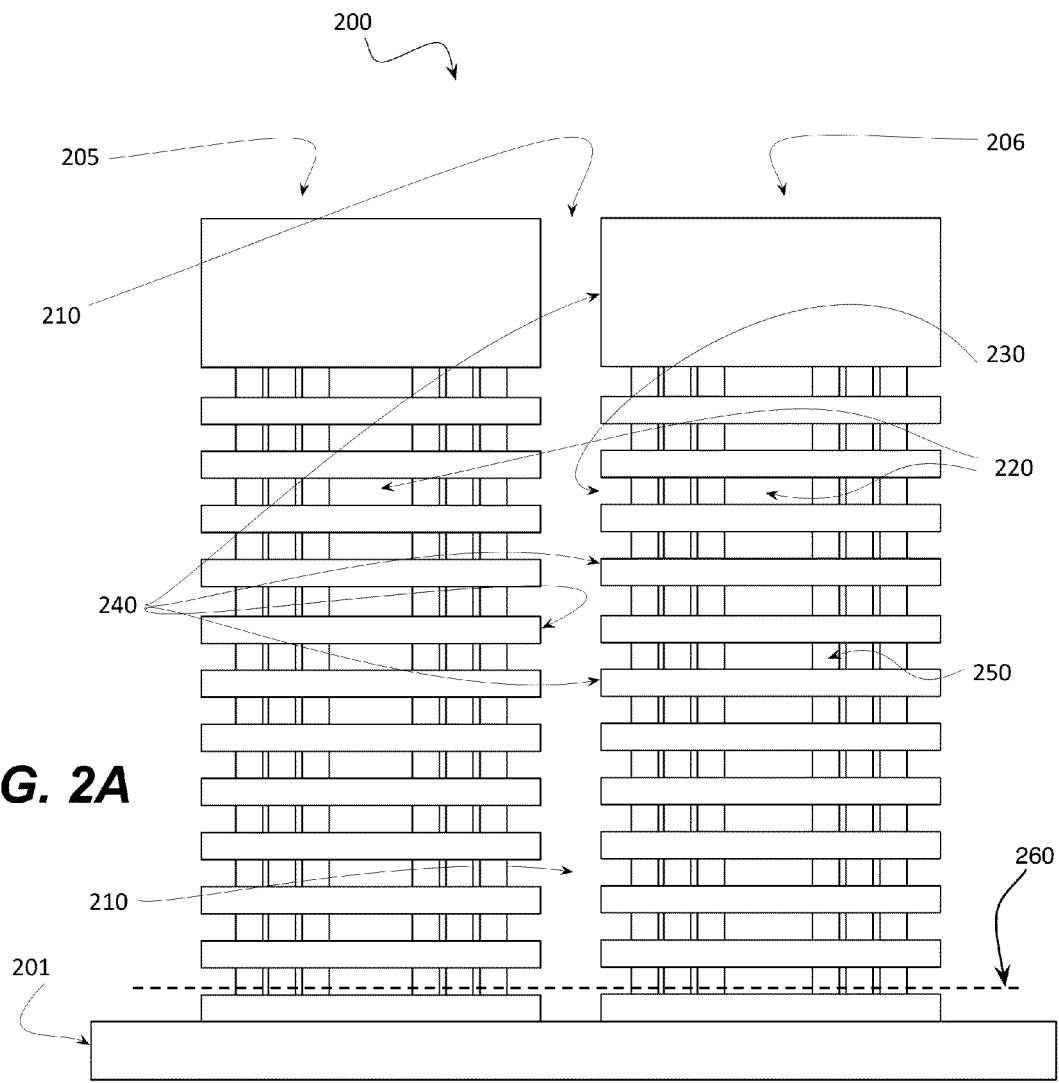
FIG. 2A presents a cross-sectional side-view of a 3D vertical memory NAND (VNAND) structure (formed on a semiconductor substrate) having VNAND stacks (left and right), a central vertical structure, and a plurality of stacked horizontal features with openings on opposite sidewalls of central vertical structure.

In the following description, numerous specific details are set forth in order to provide a thorough understanding of the present invention. However, the present invention may be practiced without some or all of these specific details. In some instances, well known process operations have not been described in detail so as to not unnecessarily obscure the disclosed inventive concepts. Moreover, while the invention will be described in the context of specific detailed embodiments, it is to be understood that these specific detailed embodiments are not intended to limit the scope of the disclosed inventive concepts.

Despite frequent employment of tungsten materials in IC design and fabrication, there are nevertheless difficulties associated with its use. For instance, depositing tungsten material into small features or features having a high aspect ratio may cause the formation of voids within the deposited tungsten. A void is simply a region within a structure or feature which is left unfilled after surrounding regions have been filled. Oftentimes, void formation is caused by a disproportionate accumulation of deposited material near a feature's entrance, resulting in the entrance becoming blocked and pinching off the interior volume of the feature preventing further deposition within the interior volume. Once blocked or pinched off, reactive deposition precursor species have no entry path into the interior volume precluding any further deposition within these regions from occurring. In other cases, even without pinch-off, a seam may be exhibited in the deposited tungsten material due to the fact that tungsten material tends to be deposited from the sidewalls out (rather than exhibiting bottom-up fill). Thus, such a seam is typically elongated along a fair portion of a feature's central axis and extends towards the bottom of the feature. Sometimes, the presence of a seam may lead to void formation, such as when a seam extends close to the field region after completion of the filling process and subsequent chemical-mechanical planarization opens the seam. In any event, seams and voids may cause high resistance, substrate contamination, loss of material, and otherwise adversely affect the electrical properties of integrated circuits. Accordingly, improved methods, apparatuses, and systems are needed in the semiconductor fabrication arts for achieving void-free and seam-free tungsten fill of substrate structures and features.

Accordingly, described herein are methods, apparatuses, and systems for achieving uniform tungsten fill of semiconductor substrate structures and features while minimizing or eliminating the formation of voids and seems. Applications of such uniform tungsten fill include logic and memory contact fill, DRAM buried wordline fill, vertically integrated memory gate/wordline fill, and 3D integration (TSV). The methods, apparatuses, and systems described herein may be used to fill vertical features—a via, for instance—as well as horizontal features, such as the horizontal wordlines within a vertical NAND (VNAND) structure—to be described in more detail below. The substrates having structures or features to be filled may be 200, 300, or 450 mm semiconductor wafers, or wafers having diameters between about 200 and 300 mm, or between about 300 and 450 mm, or greater than about 450 mm, or any appropriately sized wafer. Moreover, the methods, apparatuses, and systems, may be used to fill features with tungsten on other types of substrates, including panels, display substrates, and the like.

As indicated above, a significant problem associated with the filling of semiconductor substrate structures and features with tungsten material is the formation of seams and voids during the tungsten fill process. In particular, structures having features characterizable as having one or more of narrow and/or re-entrant openings, or constrictions, or simply having relatively high aspect ratios may be problematic. FIG. 1A shows the cross-section of a vertical feature 101 in a substrate 103 which may be designed to be filled with tungsten material. Such a vertical feature has a feature opening 105 and sidewalls 107. The vertical feature 101 may have an aspect ratio of at least about 2:1, or at least about 4:1, or at least about 6:1, or at least about 10:1, or at least about 20:1, or even higher. The feature opening 105 may have a diameter of between about 10 nanometers to 500 nanometers, for example, between about 25 to 300 nanometers.

Likewise, FIG. 1B shows an example of a similar feature 101, but having a re-entrant profile, due to the presence of an under-layer 113 lining the bottom, sidewalls, and opening of feature 101. A re-entrant profile is one exhibiting a cross-sectional narrowing somewhere between the feature opening and the bottom or a closed end of the feature thereby exhibiting a "bottleneck" in the profile. In some cases, a re-entrant profile may narrow gradually from feature opening inward, or include an overhang right at the feature opening itself. FIG. 1B shows an example of the latter—again, wherein the narrowing is due to the presence of under-layer 113 which is thicker near the feature opening than on the bottom of the feature or further down the feature sidewalls 107, and thereby forms the overhang 115. The under-layer 113 may be, for example, a diffusion barrier layer, an adhesion layer, a nucleation layer, or any combination of the foregoing, or any other potentially useful or advantageous layer of material.

In some embodiments, one or more constrictions in the sidewalls of a feature may create difficulty in achieving uniform tungsten fill. FIG. 1C illustrates a top-down plan view of an example horizontal feature 121 exhibiting a constriction 109 roughly in the middle of its sidewall 107 inhibiting access to an interior region 110. In some embodiments, such horizontal features may be what is referred to as a "wordline" in a vertically integrated memory structure such as one of the 3-D vertical NAND (VNAND) structures described in more detail below. FIG. 1D illustrates a side-view of the same horizontal feature 121 having an opening 105 to vertical structure 122, and thus forming a part of vertical structure 122. In some embodiments, and for some deposition chemistries and processes, achieving uniform tungsten fill in such a structure may be challenging because a sufficient quantity of each species of deposition precursor must travel vertically down to the base of structure 122, and then horizontally through horizontal feature 121 and, in particular, through the region of constriction 109. Once again, note that FIG. 1C presents a top-down plan view representation of horizontal feature 121 and constriction 109, while FIG. 1D presents a side-view representation of the same. Thus, it is apparent from these figures that, in this embodiment, constriction 109 extends inward horizontally and vertically from sidewalls 107 of feature 121. However, it should be understood that, in other embodiments, constrictions within a feature may only be present in one of the two cross-sectional dimensions, and any type of constriction—whether it be in one or two dimensions—may make uniform tungsten fill more challenging.

In some embodiments, the structure to be filled on a semiconductor substrate may be a vertical structure having a plurality of horizontal features with openings in the sidewalls of the vertical structure—the openings leading to a plurality of interior volumes (of the horizontal features) which are fluidically accessible from the main vertical structure through the feature openings.

For instance, FIG. 2A presents a cross-sectional side-view of a 3D vertical memory NAND (VNAND) structure 200 (formed on a semiconductor substrate 201) having VNAND stacks (left 205 and right 206), central vertical structure 210, and a plurality of stacked horizontal features 220 with openings 230 on opposite sidewalls 240 of central vertical structure 210. Note that FIG. 2A displays two "stacks" of the exhibited VNAND structure, which together form the "trench-like" central vertical structure 210, however, in certain embodiments, there may be more than two "stacks" arranged in sequence and running spatially parallel to one another, the gap between each adjacent pair of "stacks" forming a central vertical structure 210, like that explicitly illustrated in FIG. 2A. In this embodiment, the horizontal features 220 are actually 3D memory "wordlines" which are fluidically accessible from vertical structure 210 through openings 230. Although not explicitly indicated in the figure, the horizontal features 220 present in both the VNAND stacks 205, 206 shown in FIG. 2A (i.e., the left VNAND stack 205 and the right VNAND stack 206) are also accessible from the other sides of the VNAND stacks (far left and far right, respectively) through similar vertical structures formed by additional VNAND stacks (to the far left and far right, but not shown). In other words, each VNAND stack 205, 206 contains a stack of wordlines which are fluidically accessible from both sides of the VNAND stack through a central vertical structure 210. In the particular example schematically illustrated in FIG. 2A, each VNAND stack contains 6 pairs of stacked wordlines, however, in other embodiments, a 3-D VNAND memory layout may contain 8, or 16, or 32, or 64 vertically stacked pairs of wordlines corresponding to 16, or 32, or 64, or 128 stacked horizontal wordline features 220 with openings 230. Note that the wordlines in a VNAND stack are typically formed by depositing an alternating stack of silicon oxide and silicon nitride layers, and then using a process to remove the nitride layers leaving a stack of oxides layers having gaps between them. These gaps are the wordlines. In principle, any number of wordlines may be vertically stacked in such a VNAND structure so long as there is a technique for forming them available, as well as a technique available to successfully accomplish (substantially) void-free fills of the vertical features. Thus, for example, a VNAND stack may include between 2 and 256 horizontal wordline features, or between 8 and 128 horizontal wordline features, or between 16 and 64 horizontal wordline features, and so forth (the listed ranges understood to include the recited end points).

Figure 2B:
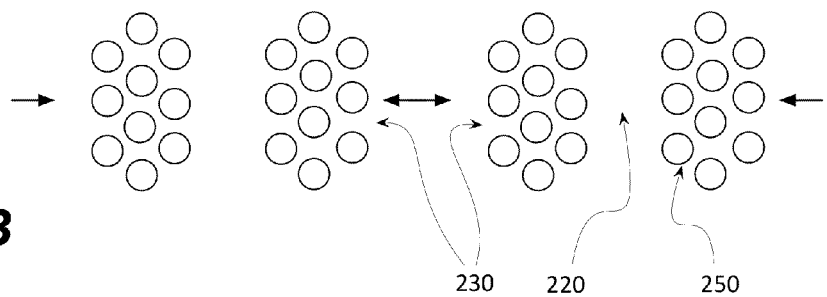
FIG. 2B presents a cross-sectional top-down view of the VNAND structure shown in side-view in FIG. 2A with the cross-section taken through the horizontal section indicated by the dashed horizontal line in FIG. 2A.

FIG. 2B presents a cross-sectional top-down view of the same VNAND structure 200 shown in side-view in FIG. 2A with the cross-section taken through the horizontal section 260 indicated in FIG. 2A (i.e., indicated by the dashed horizontal line). The cross-section of FIG. 2B illustrates several rows of pillars 250 which are shown in FIG. 2A to run vertically from the base of semiconductor substrate 201 to the top of VNAND stack 200. In some embodiments, these pillars 250 are formed from a polysilicon material and are structurally and functionally significant to VNAND structure 200. In some embodiments, such polysilicon pillars may serve as gate electrodes for stacked memory cells formed by the wordlines. The top-view of FIG. 2B illustrates that the pillars 250 form constrictions in the openings 230 to wordlines 220—i.e. fluidic accessibility of wordlines 220 from vertical structure 210 via openings 230 (as indicated by the arrows in FIG. 2B) is inhibited by pillars 250. In some embodiments, the size of the horizontal gap between adjacent polysilicon pillars is between about 1 and 20 nm. This reduction in fluidic accessibility increases the difficulty of uniformly filling wordlines 220 with tungsten material.

Figure 3A:
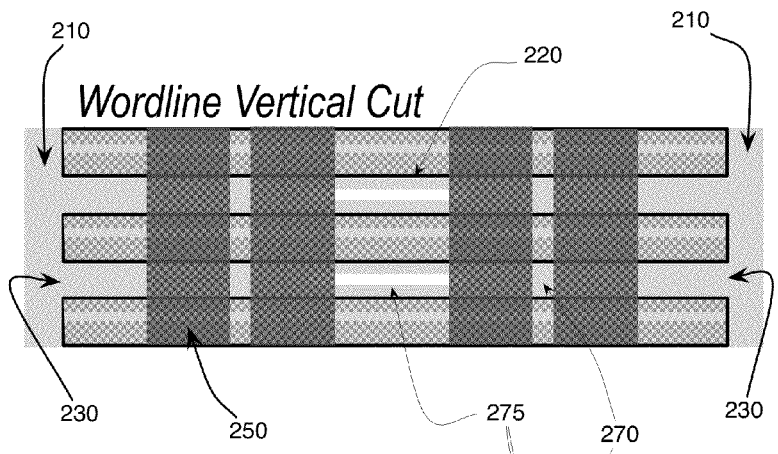
FIG. 3A exhibits a vertical cross-section (cut) of a VNAND structure similar to that shown in FIG. 2A, but in FIG. 3A focused on a single pair of wordlines and additionally schematically illustrating a tungsten fill process which resulted in the formation of voids in the wordlines.
Figure 3B:
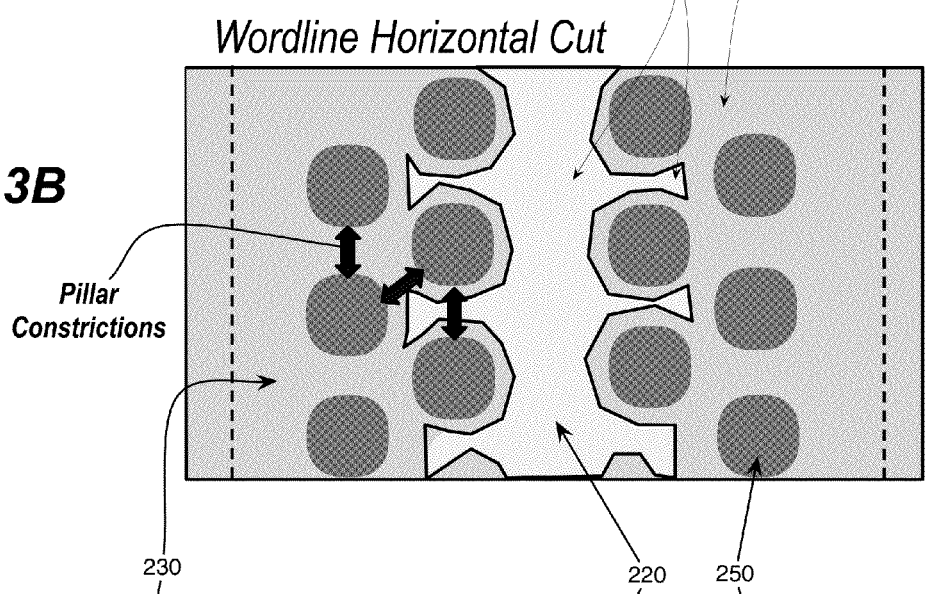
FIG. 3B exhibits a horizontal cross-section (cut) of a VNAND structure similar to that shown in FIG. 2A, and also schematically illustrating the presence of voids as in FIG. 3A.
Figure 3C:
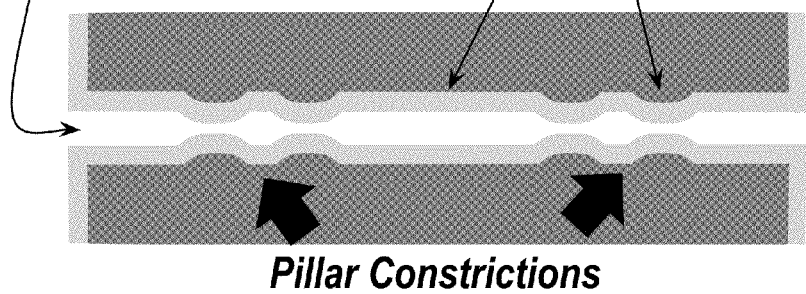
FIG. 3C exhibits a single wordline viewed cross-sectionally from above and illustrates how a generally conformal deposition of tungsten material begins to pinch-off the interior of exhibited wordline due presence of the pillars shown in the figure.

The structure of wordlines 220 and the challenge of uniformly filling them with tungsten material due to the presence of pillars 250 is further illustrated in FIGS. 3A, 3B, and 3C. FIG. 3A exhibits a vertical cut through VNAND structure 200 similar to that shown in FIG. 2A, but here focused on a single pair of wordlines 220 and additionally schematically illustrating a tungsten fill process which resulted in the formation of a voids 270 in wordlines 220. FIG. 3B also schematically illustrates the voids 270, but in this figure illustrated via a horizontal cut through pillars 250, similar to the horizontal cut exhibited in FIG. 2B. FIG. 3B illustrates the accumulation of tungsten material around the constriction-forming pillars 250, the accumulation resulting in the pinch-off of openings 230, so that no additional tungsten material can be deposited in the region of voids 270. Apparent from FIGS. 3A and 3B is that void-free tungsten fill relies on migration of sufficient quantities of deposition precursor down through vertical structure 210, through openings 220, past the constricting pillars 250, and into the furthest reaches of wordlines 220, prior to the accumulated deposition of tungsten around pillars 250 causing a pinch-off of the openings 220 and preventing further precursor migration into wordlines 230. Similarly, FIG. 3C exhibits a single wordline 230 viewed cross-sectionally from above and illustrates how a generally conformal deposition of tungsten material begins to pinch-off the interior of wordline 220 due to the fact that the significant width of pillars 250 acts to partially block, and/or narrow, and/or constrict what would otherwise be an open path through wordline 220. (It should be noted that the example in FIG. 3C can be understood as a 2-D rendering of the 3-D features of the structure of the pillar constrictions shown in FIG. 3B, thus illustrating constrictions that would be seen in a plan view rather than in a cross-sectional view.)

Accordingly, uniform deposition of tungsten containing material into constricted regions of semiconductor features can pose a significant challenge. While the examples described above specifically concern the problem of uniformly filing the memory wordlines of 3-D VNAND memory structures, the methods described herein can be applied to any sort of feature where there is a relatively constricted path from the source of the tungsten-containing material to the region of a feature where uniform tungsten deposition is desired.

One class of techniques for circumventing void formation and achieving uniform tungsten fill of horizontal features involves the combination of a tungsten deposition operation with a tungsten etch operation. The general idea is to deposit tungsten until pinch-off occurs, etch-back the pinch point to reopen the closed-off region, and then redeposit tungsten once again into the previously closed-off region. In some situations where such a technique may be employed, one intervening etch operation between a pair of deposition operations may be enough to complete a sufficiently uniform tungsten fill—even within certain horizontal features. However, in more challenging situations, additional deposition-etch cycles may be necessary for adequate fill—depending on the magnitude of a structure's aspect ratio, the degree of constriction within the horizontal feature to be filled, etc.

FIGS. 4A-1 through 4A-3 schematically illustrate an example of the foregoing dep-etch-dep procedure which may oftentimes lead to an improved tungsten fill. However, these figures also introduce the additional complication presented by uniform fill of horizontal features which are located at differing vertical depths within a high aspect ratio structure—for example, such as the VNAND structure illustrated in FIGS. 2A and 2B. FIGS. 4A-1 through 4A-3 illustrate that such a configuration may not be adequately handled by a straightforward dep-etch-dep technique.

In particular, each of FIGS. 4A-1 through 4A-3 schematically illustrate two wordlines, a top wordline 221 and a bottom wordline 222, each of which opens to the same adjacent pair of central vertical structures 210, but at differing vertical depths—and, specifically, through two symmetric pairs of openings 231 and 232, respectively. For each of these figures, note that the constrictions 250 visible in these figures actually protrude in the horizontal dimension. Like in FIG. 3C, these figures can be understood as a 2-D rendering of the 3-D features of the structure with the wordlines 221 and 222. The figures depict a cross-sectional view, but the constrictions 250 shown in the cross-sectional view actual represent constrictions that would actually only be seen in a plan view taken from above. In any event, these figures can be thought of as analogous to the 3-D VNAND structures having constricting polysilicon pillars protruding in the horizontal dimension as shown in FIGS. 2B, 3B, and 3C.

The exemplified dep-etch-dep process begins with a first deposition operation 510 and results in the pattern of tungsten deposition 270 shown in FIG. 4A-1. In both the top wordline 221 and bottom wordline 222 pinch-off has occurred preventing any further deposition within the interior (pinched-off) region of these wordlines forming void 275. Next a tungsten etch operation 515 is performed and the remaining pattern of tungsten deposition 270, post-etch, is shown in FIG. 4A-2. As shown in the figure, some tungsten 270 remains on the bottom wordline 222 which may serve as a seed layer in the next dep operation. However, due to the fact that a typical tungsten etch process will preferentially etch away tungsten towards the top of a high aspect ratio structure, a phenomenon often referred to as "etch loading," the top wordline 221 has had its tungsten entirely etched away leaving no seed layer for tungsten regrowth in the subsequent tungsten deposition operation 540. The consequence is illustrated in FIG. 4A-3. Here, bottom wordline 222 has achieved a void-free tungsten fill, but top wordline 221 is completely unfilled because etch 515 has completely removed the tungsten seed layer. Furthermore, while only two wordlines are explicitly illustrated in FIGS. 4A-1 through 4A-3, the idea of these schematic drawings is that the two explicitly illustrated wordlines may be vertically separated by many intervening wordlines (or other horizontal features). For instance, in some embodiments, 3-D VNAND stacks may employ 2 or more, 8 or more, 16 or more, 32 or more, 64 or more, 128 or more, or 256 or more vertically stacked wordlines, and thus the two wordlines explicitly shown in these figures may represent wordlines that are vertically distant from each other by tens or even a hundred or so intervening wordlines. In any case, it is typically desired that all the wordlines in a vertical stack be uniformly filled with tungsten in a void-free manner, and this goal may frequently be prevented by the aforementioned "etch loading" phenomenon. To put it simply, in an ordinary tungsten etch operation, "etch loading" makes it extremely difficult if not impossible to achieve the correct degree of lateral/horizontal etch simultaneously in both upper and lower wordlines. The upper wordlines tend to be horizontally etched too much whereas the lower wordlines too little. And, the problem generally increases as the number of vertically stacked horizontal features increases.

Accordingly, what is desired is a tungsten etch methodology which reduces (or eliminates) "etch loading" and instead etches tungsten uniformly (or at least uniformly enough) from the highest features of a high aspect ratio structure down to the lowest features. One approach for accomplishing this is shown by the flowchart in FIG. 5A which illustrates a vertical tungsten etch 520 followed by a horizontal tungsten etch 530 operation that may be performed in certain embodiments. Referring once again to high-aspect ratio structures having horizontal features at differing depths (as shown in FIGS. 2A, 3A, 3B and 4A-1 through 4A-3), embodiments may involve (i) a vertical etch operation 520 that etches away tungsten from the top of the semiconductor structure down to its base exposing the openings of the wordlines from top to bottom relatively uniformly (which may be referred to as a "wordline cut"), and (ii) a horizontal etch operation 530 that subsequently etches into the exposed wordlines opening them up through the etching away of any pinch-off points. Thus, a tungsten deposition methodology employing the foregoing two-step etch as shown in the flowchart of FIG. 5B may begin with a operation of tungsten deposition 510, proceed with a vertical etch operation 520, follow with a horizontal etch operation 530, and followed by a second tungsten deposition operation 540. In some embodiments, one or more intermediate processing operations may intervene between the vertical etch operation 520 and the horizontal etch operation 530. For example, FIG. 5C exhibits an embodiment method having a cleaning operation 525 intervene between the vertical and horizontal etch operations 520 and 530.

Figure 5A:
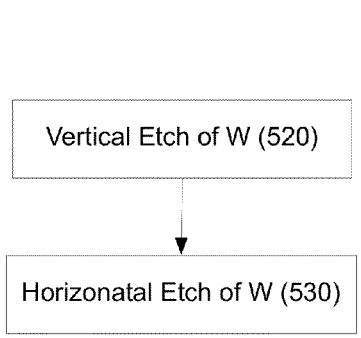
FIG. 5A presents a flowchart illustrating a vertical tungsten etch operation followed by a horizontal tungsten etch consistent with certain embodiments.
Figure 5B:
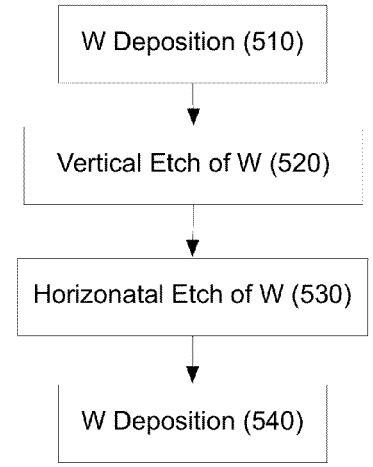
FIG. 5B presents a flowchart illustrating a tungsten deposition methodology employing the sequence of horizontal and vertical tungsten etch operations exhibited in FIG. 5A.
Figure 5C:
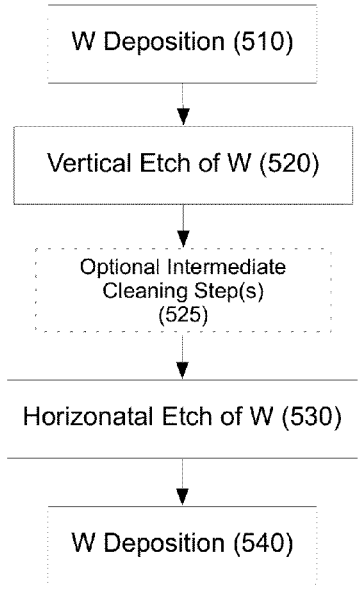
FIG. 5C presents a flowchart illustrating a tungsten deposition methodology employing an intervening cleaning operation between the vertical and horizontal etch operations exhibited in FIGS. 5A and 5B.
Figure 5D:
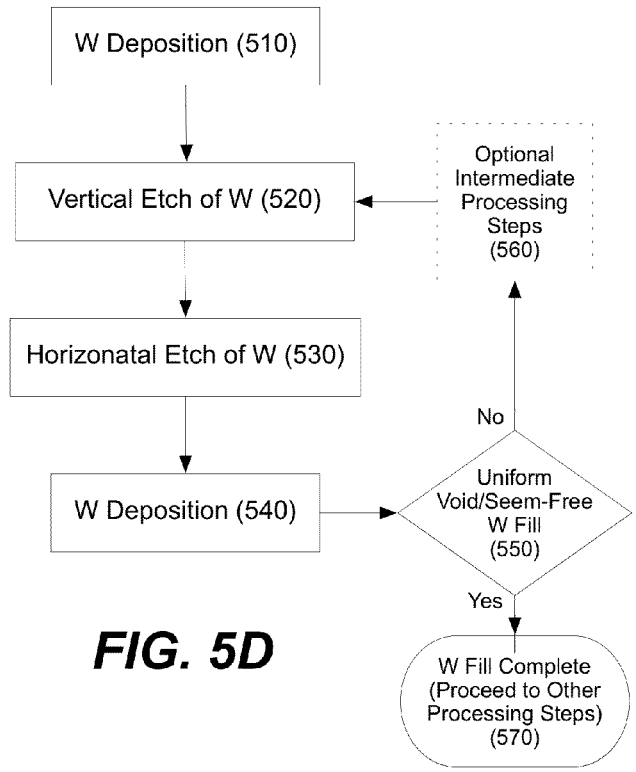
FIG. 5D presents a flowchart illustrating a tungsten deposition methodology employing a sequence of multiple tungsten deposition and etch operations.

Referring now to FIG. 5D, in alternate embodiments, multiple etch-dep cycles may be appropriate. As shown in the figure, some multi-cycle processes may involve a decision point 550 wherein the extent to which tungsten fill is uniform and void free is assessed, and if the fill is sufficiently uniform and void free processing moves forward to other processing operations 570, whereas if the fill is insufficient, processing returns to another round of etch-dep (e.g., vertical etch 520, horizontal etch 530, and deposition 540), after optionally performing certain intermediate processing operations 560. In some other embodiments, a multi-cycle process may not make the foregoing assessment, instead simply repeating the foregoing etch-dep cycle a predetermined number of times as a matter of course. Thus, depending on the embodiment, 1-25 dep-etch cycles may be performed, e.g., between 1-15, or 5-20 dep-etch cycles. In some embodiments, a range of dep-etch cycles may be performed, the endpoints of the range defined by any pair of the aforementioned values (i.e., any pair of values selected from 1-25).

It is to be noted that the horizontal etch operation 530 in FIGS. 5A through 5D may be a consequence of the chemistry and physics of the vertical etch 520 (and chosen process conditions of the vertical etch) rather than a separate etch initiated independent of the vertical etch by the operator (person or control logic) of the tungsten deposition/etch apparatus. For instance, in some embodiments, the vertical etch operation 520 may utilize an ionized etchant material which due to its electrical charge may be directionally focused (via an electric field) towards the base of the high aspect-ratio vertical feature (and thus accomplish the vertical etch). However, once ions of the vertical etchant material collide with the base of the feature they may accept electrons to create a neutral etchant species which may then diffuse outward and laterally into the horizontal features. This physical/chemical process may, in some embodiments, constitute the horizontal etch 530 indicated in FIGS. 5A through 5D. More generally, any significant lateral diffusion or mass transfer of etchant species into the horizontal features coupled with significant etching of tungsten material out of the horizontal features resulting from physical/chemical conversion of the vertical ionized etchant species may constitute horizontal etch 530. However, it is also to be noted that in other embodiments, the horizontal etch 530 may be accomplished by a sequence of one or more operations independent of the physics, chemistry, and process conditions of the vertical etch—e.g., by an independent process initiated by the operator (whether human or control logic) of the tungsten deposition/etch apparatus.

It should also be noted that the flowcharts shown in FIGS. 5A through 5D should not be read to imply that the vertical etch 520 and horizontal etch 530 occur strictly in sequence—i.e., that the vertical etch 520 is completed before the horizontal etch 530 is begun. Granted, it will oftentimes be true that a given molecule of etching species will etch vertically (e.g., as an ion) before conversion to a lateral etchant species (e.g., conversion to a neutral by acquiring one or more electrons at the base of the vertical structure) occurs, and thus an individual etchant molecule may be said to etch vertically prior to etching horizontally. However, when an ensemble of etchant molecules are viewed—in etch techniques where etchant conversion is occurring—vertical and horizontal etching will clearly be occurring simultaneously to a certain extent. Of course, to the extent that the horizontal features are not accessible because the vertical etch has not yet opened them up and/or etched down to them, in that sense, with respect to individual features, the vertical etch may be said to occur before the horizontal etch. Accordingly, in view of these points, FIGS. 5A though 5D should be interpreted to illustrate conceptually that the vertical etch etches down a vertical 3-D structure to the structure's horizontal features so that the horizontal etch can then etch into the horizontal features. This is also conceptually illustrated by the diagrams in FIGS. 4A-1 through 4C-4. (Although, it is noted that the optional cleaning step 525 in FIG. 5C may serve as a division between the two etches 520 and 530, in certain embodiments.)

Benefits associated with the filling of horizontal features via a tungsten deposition procedure which utilizes a horizontal and vertical etch approach as described with respect to FIGS. 5A-5D are illustrated in FIGS. 4B and 4C. Note that unless indicated otherwise, the reference numbers explicitly displayed in FIG. 4A-1 (repeated in FIGS. 4B-1 and 4C-1) apply to the corresponding features present in the other FIG. 4 series drawings.

The wordline fill sequence shown in FIGS. 4B-1 through 4B-4, takes advantage of a combined vertical/horizontal etch. As indicated in FIG. 4B, the tungsten fill procedure begins with tungsten deposition operation 510 (as also indicated in the flowchart of FIG. 5B) which generates a fill pattern in FIG. 4B-1 that is basically the same fill pattern schematically illustrated in FIG. 4A-1. Thus, this first deposition results in roughly equivalent pinch-off in both the top and bottom wordlines 221 and 222 shown in FIG. 4B-1 (and FIG. 4A-1) due to conformal deposition of tungsten material in the vicinity of constrictions 250 (e.g., the polysilicon pillars).

After the initial deposition operation 510, as indicated in the flowchart of FIG. 5B and the arrow directed to FIG. 4B-2, a vertical etch operation 520 is performed (as described in more detail below), which removes tungsten from the sidewalls of central vertical structures 210, without (or without appreciably) removing tungsten from the interior regions of the horizontal wordlines 221 and 222, as shown in FIG. 4B-2. This may be referred to as a "wordline cut." Afterwards, as shown in FIG. 4B-2, the interiors of wordlines 221 and 222 remain inaccessible due to the pinch-off which has not been eliminated at constrictions 250. However, as shown in FIG. 4B-2, the apparent benefit is that top and bottom wordlines 221 and 222 have been roughly equally etched—i.e., there is no "etch-loading" effect. This can be visualized as resulting from the directional character of the vertical etch, specifically, from the fact that the vertical etch is directed downward towards the base of the semiconductor structure; and so the vertical etch substantially evenly and uniformly vertically removes tungsten from the central vertical structure without appreciably laterally removing tungsten from the horizontal features.

With the sidewalls of central vertical structures 210 substantially cleared of tungsten, a horizontal etch operation 530 is performed, as indicated in FIG. 5B and by the arrow directed at FIG. 4B-3. Rather than having a primarily directional character, in some embodiments, horizontal etch 530 may work generally isotropically, allowing activated etchant material to etch laterally into horizontal features, removing pinch-off points, and thus opening up the interior regions of wordlines 221 and 222. FIG. 4B-3 illustrates the pattern of retained tungsten deposition after horizontal etch 530, and unlike the etch-loading effect illustrated in FIG. 4A-2, in FIG. 4B-3, top and bottom wordlines 221 and 222 retain approximately equal amounts of tungsten deposition within their interior regions. Because a tungsten seed layer remains in both wordlines, effective tungsten regrowth may occur during subsequent deposition. Thus, the tungsten deposition operation 540 which follows to complete the tungsten fill operation, as indicated in FIG. 5B and the arrow directed to FIG. 4B-4, results in a uniform and void-free tungsten fill as shown in FIG. 4B-4—in contrast to the lack of tungsten regrowth exhibit on the upper wordline 221 shown in FIG. 4A-3.

It should also be understood that, in some embodiments, the activated etching material used in the horizontal etch operation 530 may operate in a diffusion-limited etch regime and, as such, there may be some small degree of etch loading present when comparing the top and bottom of a high aspect ratio feature during the horizontal etch. (Put another way, in some regions of the semiconductor structure, the rate of diffusion cannot keep up with the rate of the etch chemistry.) Nevertheless, this small degree of etch loading does not result in the problem exemplified by FIG. 4A-3 (complete elimination of tungsten seed layer and no regrowth in the upper wordlines) because the vast majority of the etch loading has been circumvented by the directional vertical etch operation 520.

Finally, FIGS. 4C-1 through 4C-4 schematically illustrate a slightly different embodiment of the vertical and horizontal etch methodology shown in FIGS. 4B-1 through 4B-4. In each of the FIG. 4 series of diagrams, the walls of the semiconductor structure are coated with a thin layer of titanium nitride (TiN). This titanium nitride layer 280 may function to nucleate growth of the tungsten film being deposited. Since tungsten deposition is much slower or non-existent on bare silicon or silicon coated with a layer of silicon oxide (at least much slower under the typical range of operating conditions used in this type of processing), without a TiN layer 280, or a suitable substitute, tungsten growth will generally not occur. Moreover, while the presence of a TiN layer may be advantageous and even necessary, in some embodiments, selective removal of the TiN layer 280 may also be advantageous. Hence, schematically displayed in FIG. 4C-1 is the result of a vertical etch operation 521 which utilizes an activated etching material capable of etching away the TiN layer 280 leaving exposed bare silicon 281. After vertical etch 521, the horizontal etch 530 proceeds as usual, followed by the second operation of tungsten deposition 540. The result shown in FIG. 4C-4 is a void-free uniform deposition of tungsten material localized within wordlines 221 and 222 (because that is the only region where the TiN layer 280 remains), rather than tungsten growth extending onto the sidewalls of central vertical structures 210 as in FIG. 4B-4. Of course, this leaves the vertically stacked wordlines electrically isolated from one another—the eventual goal if these stacked wordlines are to be used as memory cells in a 3-D NAND memory device.

Figure 4D:
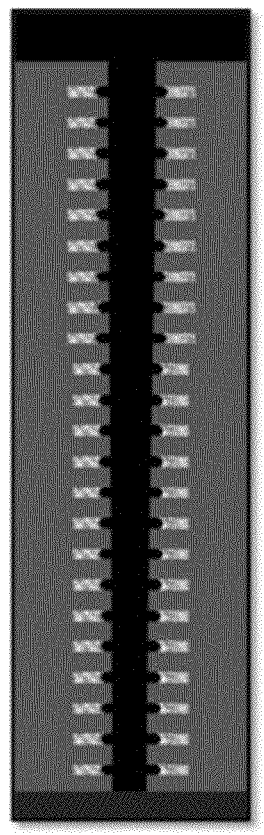
FIG. 4D displays an electron micrograph illustrating a result of employing certain techniques and operations disclosed herein for achieving substantially uniform/void-free tungsten fill of 3-D vertical structures having horizontal features.

FIG. 4D displays an electron micrograph illustrating a result obtained by employing certain techniques and operations disclosed herein for achieving substantially uniform/void-free tungsten fill of 3-D vertical structures having horizontal features.

Tungsten Deposition

As described above, the methodologies disclosed herein for uniformly filing semiconductor structures and features with tungsten-containing material employ one or more operations of tungsten deposition. In some embodiments, the tungsten deposition may be described as substantially conformal and may be accomplished via a reaction between a tungsten-containing precursor and a reducing agent. In certain such embodiments, the tungsten is initially deposited atop an underlayer which covers the bare silicon substrate (or oxidized surface of the silicon substrate).

The underlayer may serve as a diffusion barrier layer, as a nucleation layer for conformal tungsten deposition, or both. Since conformal tungsten deposition generally does not occur on bare or oxidized silicon in the thermodynamic regimes relevant to semiconductor fabrication, some sort of underlayer is generally necessary, as stated above. Note that the "underlayer" referred to here is also referred to in this disclosure as an "outer layer" of a partially manufactured semiconductor substrate which is susceptible to tungsten deposition and upon which tungsten is to be deposited. The terminology is, of course, consistent because what is an "outer layer" of the semiconductor substrate prior to tungsten deposition serves as an "underlayer" to the tungsten deposition itself. Thus, in some embodiments, a partially manufactured semiconductor substrate may include a structure having an outer layer susceptible to tungsten deposition and upon which a layer of tungsten-containing material may be deposited. In any event, whether referred to as the outer layer of the substrate or an underlayer to the tungsten deposition, this layer may include one or more types of metal nitrides and, in some embodiments, titanium nitride (TiN) and/or tungsten nitride (WN) and/or others. The layer may be between about 10 Å and 500 Å (Angstroms) thick or, in more specific embodiments, between about 25 Å and 200 Å thick. Furthermore, while in some embodiments, a vertical etch operation to remove tungsten from the sidewalls of the structure may not appreciably affect the aforementioned outer layer susceptible to tungsten deposition and upon which the tungsten was deposited, in other embodiments, the vertical etch operation may remove portions of this layer on at least portions of the sidewalls of the structure. In these later embodiments, substantially no tungsten is deposited upon these portions of the sidewalls during any deposition of subsequent layers of tungsten-containing material. Once again, this is illustrated in FIGS. 4C-1 through 4C-4.

When serving as a nucleation layer, the underlayer is typically a thin conformal layer that facilitates subsequent deposition of bulk tungsten-containing material thereon. In certain embodiments, the nucleation layer is deposited using a pulsed nucleation layer (PNL) technique. In a PNL technique, pulses of the reducing agent and tungsten-containing precursor are sequentially injected into and purged (via a injected pulse of purge gas) from the reaction chamber. The process is repeated in a cyclical fashion until the desired thickness is achieved. PNL broadly embodies any cyclical process of sequentially adding reactants for reaction on a semiconductor substrate, including atomic layer deposition (ALD) techniques. PNL techniques for depositing tungsten nucleation layers are described in U.S. patent application Ser. No. 12/030,645 filed on Feb. 13, 2008, U.S. patent application Ser. No. 11/951,236, filed Dec. 5, 2007, and U.S. patent application Ser. No. 12/407,541, filed on Mar. 19, 2009, each of which are hereby incorporated by reference in their entirety for all purposes. Additional discussion regarding PNL type processes can be found in U.S. Pat. Nos. 6,635,965, 6,844,258, 7,005,372 and 7,141,494 as well as in U.S. patent application Ser. No. 11/265,531, each of which are also hereby incorporated by reference in their entirety for all purposes. The methods described herein are not limited to a particular method of tungsten nucleation layer deposition, but include deposition of bulk tungsten film on tungsten nucleation layers formed by any method including PNL, ALD, CVD, PVD and any other method. Moreover, in certain embodiments, bulk tungsten may be deposited directly without use of a nucleation layer.

A deposition station may be used to deposit tungsten but also used to perform certain prior operations (e.g., deposition of a diffusion barrier layer, deposition of a nucleation layer) and/or subsequent operations (e.g., etching of deposited tungsten, another tungsten deposition, final feature filling). In certain embodiments, the deposition station may be specifically designated to perform tungsten deposition operations 510 and 540 of FIG. 5. The apparatus may also include additional deposition stations to perform these deposition operations. For example, an initial tungsten deposition (e.g., operation 510 of FIG. 5) may be performed on the first deposition station. The semiconductor substrate may be then moved to another station for etching such as for vertical or horizontal etch (e.g., operations 520 and/or 530 of FIG. 5). In certain embodiments further described below, an etching station is positioned in a different chamber to prevent cross-contamination between deposition and etching environments that use different materials and conditions for their respective operations. If the process then uses another deposition operation (e.g., operation 540 of FIG. 5), the substrate may be returned back to the first deposition station or moved to another deposition station. Multiple deposition stations may be also used to perform parallel deposition operations on several substrates. Additional details and apparatus embodiments are explained below in the context of FIGS. 6, 7, and 8.

In some embodiments, tungsten deposition involves a chemical vapor deposition (CVD) process in which a tungsten-containing precursor is reduced by hydrogen to deposit tungsten. While tungsten hexafluoride ($WF_6$) is often used, the process may be performed with other tungsten precursors, including, but not limited to, tungsten hexachloride ($WCl_6$), organo-metallic precursors, and precursors that are free of fluorine such as MDNOW (methylcyclopentadienyl-dicarbonylnitrosyl-tungsten) and EDNOW (ethylcyclopentadienyl-dicarbonylnitrosyl-tungsten). In addition, while hydrogen is generally used as the reducing agent in the CVD deposition of the bulk tungsten layer, other reducing agents including silane may be used in addition or instead of hydrogen without departing from the scope of the invention. In another embodiment, tungsten hexacarbonyl ($W(CO)_6$) may be used with or without a reducing agent. Unlike with the PNL processes described above, in a CVD technique, the $WF_6$ and $H_2$ or other reactants are simultaneously introduced into the reaction chamber. This produces a continuous chemical reaction of mix reactant gases that continuously forms tungsten film on the substrate surface. Methods of depositing tungsten films using chemical vapor deposition (CVD) are described in U.S. patent application Ser. No. 12/202,126 filed Aug. 29, 2008, which is hereby incorporated by reference in its entirety for the purposes of describing deposition processes. According to various embodiments, the methods described herein are not limited to a particular method of partially filling a feature but may include any appropriate deposition technique. Further details relating to methods of depositing tungsten onto partially manufactured semiconductor substrates may be found in U.S. Pat. No. 8,124,531 which is hereby incorporated by reference in its entirely for all purposes.

Whatever deposition process is used, a deposition operation may proceed until the deposited layer reaches a certain thickness. In some embodiments, the selected thickness may depend on the width of any constricted regions within the horizontal features of a high aspect ratio structure. For example, once pinch-off occurs within such a horizontal feature, further tungsten deposition within the feature is prevented. Thus, once the average thickness of a deposited layer within a feature reaches a value approximately equal to the average radius of the narrowest point of constriction within the horizontal feature, it may be an appropriate point to halt tungsten deposition and begin the tungsten etch sequence described above.

Vertical Etching

As described above, techniques for achieving uniform tungsten deposition which are disclosed herein may employ vertical etching after depositing an initial layer of tungsten. Once again, as described above, the vertical etching is performed in order to accomplish a "wordline cut" down the central vertical structure formed by adjacent 3-D VNAND stacks while minimize or eliminating the "etch loading" phenomenon. As also described above, this vertical etching may be characterized as a directional etch (at least relatively speaking) and, as such, it does not appreciably etch tungsten laterally from the horizontal features which open onto the central vertical structure. (However, it should be understood that in embodiments where the vertical etching material converts to a horizontal etching material at the base/bottom of the vertical feature being etched, the characterization of not etching laterally only applies to the etchant before the conversion to a lateral etchant.) Thus, in some embodiments, the vertical etch operation includes providing an activated etching material, and removing portions of the initially-deposited layer of tungsten-containing material from the sidewalls of the vertical structure using the activated etching material without substantially removing portions of the initially deposited layer of tungsten from the interiors of the horizontal features.

The activated etching material may be an ionized plasma including one or more ion species which is generated in situ (in the processing chamber). The vertical etch—directional wordline cut—may thus be performed by applying an electromagnetic field to the ions in the plasma and directing the ions towards the bottom or base of the high aspect ratio feature/3-D structure to be vertically etched. Chemical precursors to the ionized plasma species (i.e., plasma reagents which will generate the ion species through ionization within the processing chamber) may include various forms of fluorine-containing compounds. One example is $NF_3$. Other examples include $CF_4$, $CHF_3$, $CH_2F_2$, $CH_3F$, or $SF_6$ (although $SF_6$ may be found to be overly aggressive). Examples of non-fluorine containing plasma reagents may include $Cl_2$. Plasma reagents used to form the ionized plasma species are typically provided to the processing chamber where the etch is to occur via one or more supply lines fluidically coupled to the processing chamber. Flow rate of plasma reagents into the processing chamber may be between about 100 and 1000 sccm, or more preferably between about 100 and 700 sccm, or even more preferably between about 300 and 700 sccm, or yet more preferably between about 400 and 600 sccm, or, in some embodiments, between about 100 and 500 sccm.

In addition to the aforementioned plasma reagents, a vertical etch operation may be enhanced via the use of a diluent gas which may be flowed to the processing chamber during the vertical etch operation at a rate of about 500 to 2000 sccm, or more particularly about 1000 to 1500 sccm. In some embodiments, the diluent gas may be Helium or Argon (or both) or some other inert gas (or combination of inert gases). The diluent may work to enhance etch rate during the vertical etch operation by increasing the rate of diffusion of etchant byproduct, typically $WF_6$, out of (and/or away from) the structure being etched. For instance, a high flow rate of Ar, He, or some other inert diluent gas over the top surface of a wafer substrate may increase the concentration gradient of etch byproduct inside versus outside the vertical feature being etched and thereby reduce the diffusion barrier to byproduct removal.

In some embodiments, polymeric precursors to a polymeric sacrificial protection material may also be provided to the processing chamber in order to form a sacrificial protection layer. In some circumstances, the sacrificial protection layer may attenuate the extent to which upper portions of the central vertical structure of the 3-D NAND trench are etched, thereby preventing overetching at the top. In a sense, the sacrificial protection layer enhances the directionality of the vertical etch. Chemical polymeric precursors to the sacrificial protection layer include various forms of fluorine-containing compounds. Specific examples include $CF_4$, $CHF_3$, $CH_2F_2$, and $CH_3F$. Polymeric precursor species are also typically provided to the processing chamber where the etch is to occur via one or more supply lines fluidically coupled to the processing chamber. Flow rate of polymeric precursor into the processing chamber may be between about 10 to 100 sccm, or more preferably between about 20 to 60 sccm, or yet more preferably between about 30 to 40 sccm.

The vertical etch may be performed over a range of chamber operating conditions. In some embodiments, temperature within the processing chamber during the vertical etch may be maintained between about 10 and 140° C., or more particularly between about 20 and 120° C., or yet more particularly between about 30 and 100° C., or still yet more particularly, between about 40 and 80° C., or in some embodiments, about 60° C. In some embodiments, pressure within the processing chamber during the vertical etch may be maintained between about 20 and 120 mTorr, or more preferably between about 30 and 100 mTorr, or yet more preferably between about 50 and 90 mTorr or between about 40 and 80 mTorr. Apparatuses employing an in situ generated plasma for tungsten etch operations are described in greater detail below.

In some embodiments, an inductively coupled plasma reactor is used to generate the in situ plasma used in the vertical etch. Inductively coupled plasmas and associated inductively coupled plasma reactors are described in U.S. Pat. No. 6,184,158, hereby incorporated by reference in its entirety for all purposes. Examples of inductively coupled plasma reactor apparatuses are also described below with respect to FIG. 9.

In some embodiments, the plasma including the ion species used in the vertical etch operation is an inductively-coupled plasma generated and maintained by inductively-coupled RF power. The RF power may have a frequency between about 13 MHz and 60 MHz while also generated and maintained by substrate-biased RF power having a frequency between about 400 kHz and 14 MHz (such as about 13.56 MHz). In some embodiments, the substrate-biased RF power has a voltage between about 100 and 1000 Volts relative to the substrate, or more particularly a voltage between about 100 and 700 volts, or yet more particularly between about 100 and 500 Volts relative to the substrate. In some embodiments, methods employing an inductively-coupled plasma may further include pulsing the substrate-biased RF power at a pulse rate between about 100 and 2000 Hz, or more particularly at a pulse rate between about 100 and 300 Hz or at a pulse rate between about 400 and 900 Hz, and with a duty cycle between about 10% and 90%, or more particularly with a duty cycle between about 10% and 60%. Pulsing the bias voltage in this manner has been found to enhance the vertical etch rate, in some embodiments.

In some embodiments, the inductively-coupled RF power is between about 500 and 1900 Watts, or more particularly between about 500 and 600 Watts or between about 1300 and 1900 Watts. In some embodiments, the inductively-coupled RF power is generated by generating coils including a first generating coil and a second generating coil, the first generating coil supplying inductively-coupled RF power to an inner region of the processing chamber, the second generating coil supplying inductively-coupled RF power to an outer region of the processing chamber, and wherein the total inductively-coupled RF power is split between the first and second generating coils in a ratio between about 0.1 and 1.5. In some embodiments, a plasma including free radical species used in the horizontal etch operation is generated and maintained by RF power.

Note that in some embodiments, it is feasible to use a wet etch technique to perform the wordline cut for removing tungsten primarily from the sidewalls of the central vertical structure without appreciably etching laterally into the horizontal features.

Horizontal Etching

As described above, techniques for achieving uniform tungsten deposition which are disclosed herein may employ horizontal etching in addition to vertical etching. Once again, as described above, the horizontal etching may be used to etch laterally and open pinch-off points formed by the previously deposited tungsten material within the horizontal wordlines of 3-D VNAND stacks. In some embodiments, the horizontal etch operation may include providing an activated etching material, and removing portions of the initially-deposited layer of tungsten-containing material from within the interiors of the wordlines using the activated etching material. In some embodiments, the activated etching material may be generated remotely from the processing chamber (as described below) and flowed to the processing chamber to perform the horizontal etch operation. In other embodiments, as indicated above, the activated etching material used in the horizontal etch operation may be generated from conversion of the activated etching material used in the vertical etch operation—the conversion occurring within the vertical feature/structure being etched. For instance, if the vertical etching material includes an ion species (directed via electric field to the base of the vertical feature), the ion species may convert to a neutral horizontal/lateral etching material by accepting electrons from the surrounding material after collision with the substrate at the base of the vertical structure.

The activated etching material used in horizontal etching may be a free radical-based plasma. In certain such embodiments, the free radical-based plasma may be generated remotely from the processing chamber before being introduced to the processing chamber to perform the horizontal etch. Free radical species making up the plasma may include a variety of fluorine radical species, and correspondingly the chemical precursors to this free radical-based plasma (i.e., plasma reagents) may include various forms of fluorine-containing compounds. Examples include $NF_3$. Other examples include $CF_4$, $CHF_3$, $CH_2F_2$, and $CH_3F$, or even possibly $SF_6$ in some embodiments. In addition, non-fluorine containing plasma reagents may include other etchants such as chlorine-containing compounds.

In embodiments employing a remotely generated plasma, the excited gas including the plasma may be supplied to the processing chamber where the horizontal etch is to occur via one or more gas conduits or supply lines fluidically coupled to the processing chamber. Apparatuses employing a remotely generated plasma for tungsten etch operations are described in greater detail below.

The horizontal etch may be performed over a range of chamber operating conditions. In some embodiments, temperature within the processing chamber during the horizontal etch may be maintained between about 50 and 400° C., or more particularly between about 50 and 250° C. In some embodiments, a temperature of less than about 150° C. may be used. In some embodiments, pressure within the processing chamber during the vertical etch may be maintained at less than about 10 Torr, for example, less than about 5 Torr, or even less than about 2 Torr. In some embodiments, the process conditions during the horizontal etch are the same as those employed during the vertical etch, such as when the activated etching material used in the horizontal etch is generated through conversion of the activated etching material used in the vertical etch.

Various techniques for horizontal etch are described in U.S. patent application Ser. No. 13/851,885, filed Mar. 27, 2013, incorporated by reference herein for all purposes. For example, etch conformality modulation is described therein and may be employed to tune the feature profile during the horizontal etch. Temperature, pressure and flow rate may be controlled to tune the profile of a fluorine radical based etch, for example. At higher temperatures, the incoming fluorine atoms readily react and etch at the feature entrance, resulting in a more non-conformal etch; at lower temperature, the incoming fluorine atoms are able to diffuse and etch further into the feature, resulting in a more conformal etch. Higher etchant flow rate will result in more fluorine atoms generated, causing more fluorine atoms to diffuse and etch further into the feature, resulting in a more conformal etch. Lower etchant flow rate will result in fewer fluorine atoms generated, which will tend to react and etch at the feature entrance, resulting in a more non conformal etch. Higher pressure will cause more recombination of fluorine radicals to form molecular fluorine. Molecular fluorine has a lower sticking coefficient than fluorine radicals and so diffuses more readily into the feature before etching tungsten, leading to a more conformal etch.

Apparatuses

The tungsten deposition and etch methods presented herein may be carried out in a variety of deposition and/or etch apparatuses available from various vendors. Examples of apparatuses which may be suitable include the Novellus Concept-1 ALTUS™, Concept-2 ALTUS™, Concept-2 ALTUS-S™, Concept-3 ALTUS™, and ALTUS Max™ deposition systems, or any of a variety of other commercially available chemical vapor deposition (CVD) tools. An example of an apparatus which may be used, in some embodiments, to perform various vertical and/or horizontal etch operations is Lam Research's Kiyo etch tool. Other examples include Applied Materials' Mesa and C3 products and the like. Tokyo Electronic's RLSA and the like may be used for the lateral etch, in some embodiments. Hitachi also manufactures various tools which may be used for horizontal and/or vertical etching, in some embodiments. Generally, the tool used for vertical and possibly horizontal etching operations will be capable of generating an ion plasma and directing ions of the plasma towards the substrate, preferably with a directionality substantially perpendicular to the plane of the substrate.

Figure 6:
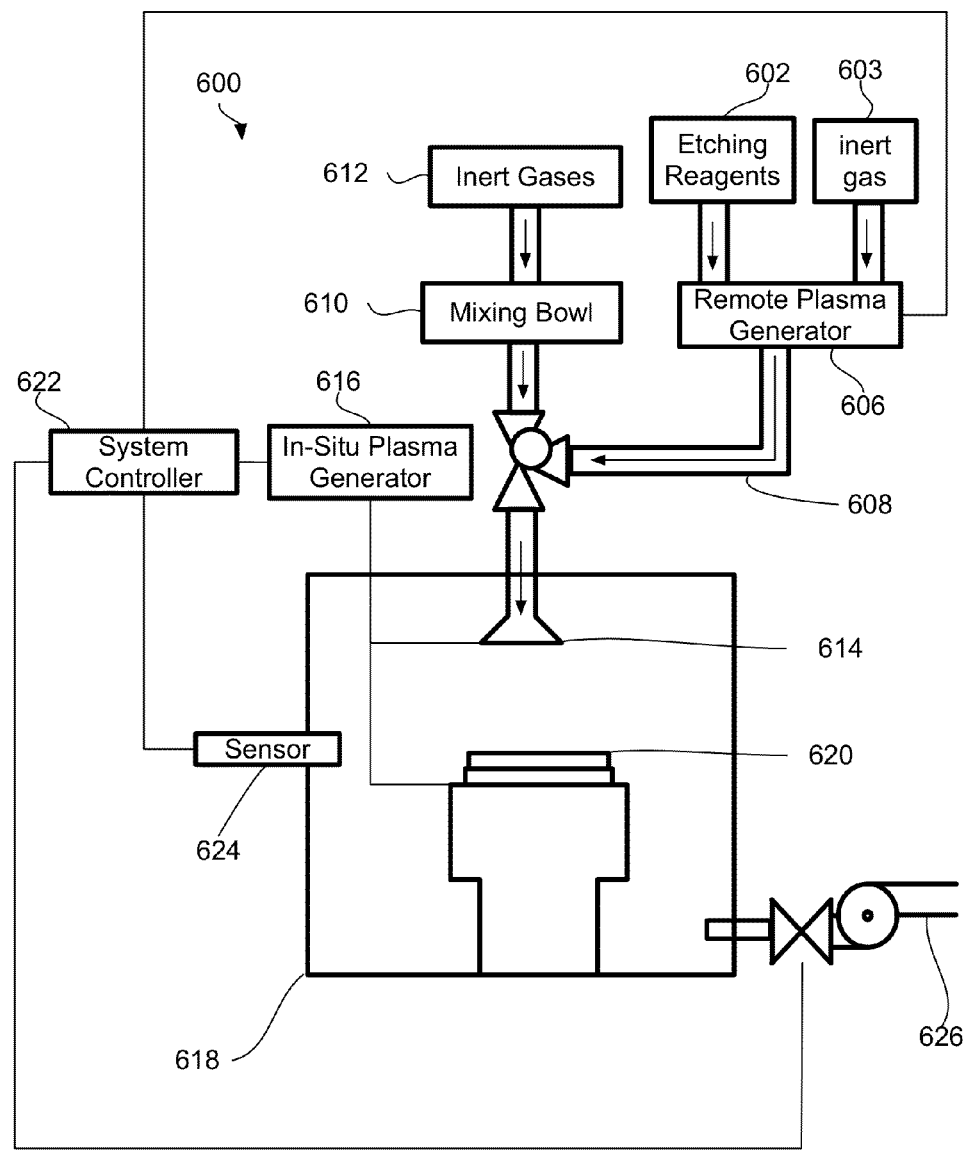
FIG. 6 schematically illustrates a processing chamber and associated hardware which may be employed to perform certain tungsten deposition and/or etch operations in accordance with certain embodiments disclosed herein.

FIG. 6 illustrates a schematic representation of an apparatus 600 for processing a partially fabricated semiconductor substrate in accordance with certain embodiments. The apparatus 600 includes a chamber 618 with a pedestal 620, a shower head 614, an in-situ plasma generator 616, and a remote plasma generator 606. The apparatus 600 also includes a system controller 622 to receive input and/or supply control signals to various devices.

As described above, some of the methods disclosed herein for achieving a uniform tungsten fill of semiconductor features (or at least substantially uniform, and/or comparatively or relatively uniform) involve a operation of etching tungsten using an activated etching material that may be a plasma which includes one or more free radical species. In some embodiments, a plasma generator remote from the processing chamber but fluidically coupled to it may be used to generate the plasma and free radical species which is then provided to the processing chamber via fluidic coupling. The embodiment schematically illustrated in FIG. 6 is one such embodiment, for instance, it having a remote plasma generator 606 in fluidic communication with processing chamber 618 via connecting line 608. System controller 622 may control operation of the remote plasma generator 606, as well as controlling the supply of activated etching material from the remote plasma generator 606 to the processing chamber 618, as depicted in the figure.

Any suitable remote plasma generator may be used for activating the tungsten etchant before introducing it into the chamber 618. For example, remote plasma generating units, such as ASTRON® i Type AX7670, ASTRON® e Type AX7680, ASTRON® ex Type AX7685, ASTRON® hf-s Type AX7645, all available from MKS Instruments of Andover, Mass., may be used. In general, a remote plasma generator unit is typically a self-contained device generating a free-radical based plasma (which may also to some extent be weakly ionized) using the supplied etchant reagent. The remote plasma generator is a high power RF generator that provides energy to the electrons in the plasma. This energy is then transferred to the neutral etchant reagent leading to temperature on the order of 20,00K causing thermal dissociation of these molecules. A remote plasma generator unit may dissociate more than 60% of incoming etchant reagent because of its high RF energy and special channel geometry causing the etchant to adsorb most of this energy. In some embodiments, a microwave source may be used to excite molecules of the etchant reagent. In some embodiments, suitable plasmas may be generated by operating the remote plasma generator at an RF of between about 400 kHz and 60 MHz, or between about 400 kHz and 27 MHz, or between about 27 and 60 MHz, or specifically at 13.56 MHz or 27

MHZ or 60 MHz; and generating between about 400 and 2000 Watts of RF power, depending on the embodiment.

In certain embodiments, such as that illustrated in FIG. 6, an etchant is flown from the remote plasma generator 606 through a connecting line 608 into the chamber 618, where the mixture is distributed through shower head 614. Chemical species serving as precursors to the activated etching material (which is generated in the remote plasma generator)—i.e., etchant reagents—may be supplied to the generator via a source 602, which may be a storage tank. In addition, in certain embodiments, inert gases, such as argon, helium and others, are also supplied to the remote plasma generator 606 from a source 603, which may also be a storage tank.

In some embodiments, such as described above, the tungsten deposition and etching operations disclosed herein may employ an activated etchant material which is activated within the processing chamber 618 itself (i.e., in situ)—either instead of, or in addition to, remote activation, such as plasma generation in a remote plasma generator 606. In certain such embodiments, such an in situ generated plasma may include one or more ionized etchant species. In certain such embodiments, these ions may be directed by an applied electromagnetic field towards the tungsten material to be etched.

Various suitable precursor etchant reagents, such as various fluorine containing compounds, are described above. In embodiments employing in situ plasma activation, these precursor species may be provided directly to the processing chamber—in a manner which completely bypasses the remote plasma generator 606—such as by directly delivering etchant through a connecting line which is similar to that of FIG. 6's connecting line 608, but which does not actually connect to the remote plasma generator 606. In some embodiments, the remote plasma generator may not even be present. Alternatively, delivery to the processing chamber of etchant reagent for in situ plasma generation may be accomplished by turning off the remote plasma generator 606 while allowing etchant reagent to be flowed through it and then into the chamber 618 where it is activated. Of course, once again, this in situ plasma activation/generation may be instead of, or in addition to, remote plasma activation.

Once the precursor etchant reagents are introduced into the processing chamber 618, in situ plasma activation may be accomplished via an internal plasma generator 616 attached to the shower head 614 and the pedestal 620. In a particular embodiment, the internal plasma generator 616 is a High Frequency (HF) RF generator capable of providing between about 0 W and 10,000 W of power at frequencies between about 1 and 100 MHz. In a more specific embodiment, the HF RF generator may deliver between about 0 and 5,000 W of power at about 13.56 MHz.

As described above, such an in situ plasma may be used to remove deposited tungsten-containing material from the sidewalls of various high aspect ratio vertical structures, in some embodiments, without substantially removing tungsten-containing material from the interiors of horizontal features with openings in the sidewalls of the vertical structures. In some embodiments, the in situ generated plasma may include one or more ion species. In certain such embodiments, the preferential etch of vertical sidewalls versus horizontal feature interiors may be achieved by applying an electromagnetic field to the ions so that a portion of the ions are directed generally downwards, towards the bottom of the vertical features being etched (once again, as described in greater detail above).

The chamber 618 may include a sensor 624 for sensing various process parameters, such as degree of deposition and etching, concentrations, pressure, temperature, and others. The sensor 624 may provide information on chamber conditions during the process to the system controller 622. Examples of the sensor 624 include mass flow controllers, pressure sensors, thermocouples, and others. The sensor 624 may also include an infra-red detector or optical detector to monitor presence of gases in the chamber and control measures. Sensors may provide information which may be used to determine the flow rates of reducing agents and tungsten-containing precursors to the processing chamber, as well as flow rates of plasma species and their precursors from and to, respectively, the remote plasma generator 606.

Deposition and selective removal operations generate various volatile species that are evacuated from the chamber 618. Moreover, processing is performed at certain predetermined pressure levels the chamber 618. Both of these functions are achieved using a vacuum outlet 626, which may be a vacuum pump. In some embodiments, any required or beneficial processes gases may be provided to the chamber 618 from process gas source 612 after passing through mixing bowl 610, as schematically illustrated in FIG. 6.

In certain embodiments, a system controller 622 is employed to control process conditions and parameters during tungsten deposition and etch operations. The system controller 622 typically includes one or more memory devices and one or more processors. The processor may include a CPU or computer, analog and/or digital input/output connections, stepper motor controller boards, etc. Typically there will be a user interface associated with system controller 622. The user interface may include a display screen, graphical software displays of the apparatus and/or process conditions, and user input devices such as pointing devices, keyboards, touch screens, microphones, etc.

In certain embodiments, the system controller 622 controls the substrate temperature, chamber pressure, etchant reagent (activated etchant precursor) flow rates, power output and operating frequency (or frequency range) of the remote plasma generator 606, power output and operating frequency (or frequency range) of the in situ plasma generator 616, and other process parameters. The system controller 622 executes system control software and instructions to provide the aforementioned control. Other computer programs stored on memory devices associated with the controller may be employed in some embodiments.

The computer program code for controlling the processes in a process sequence can be written in any conventional computer readable programming language: for example, assembly language, C, C++, Pascal, Fortran or others. Compiled object code or script is executed by the processor to perform the tasks identified in the program. The system software may be designed or configured in many different ways. For example, various chamber component subroutines or control objects may be written to control operation of the chamber components necessary to carry out the described processes. Examples of programs or sections of programs for this purpose include substrate temperature control code, chamber pressure control code, etchant reagent (activated etchant precursor) flow rate control code, process gas control code, remote plasma generator control code (possibly including power output and operating frequency control code), in situ plasma generator control code (possibly including power output and operating frequency control code), and control code for other process parameters.

Parameters for controlling substrate temperature, chamber pressure, etchant reagent (activated etchant precursor) flow rates, power output and operating frequency (or frequency range) of the remote plasma generator, power output and operating frequency (or frequency range) of the in situ plasma generator, and other process parameters may be provided by the user in the form of a recipe, and may be entered utilizing the user interface.

Signals for monitoring the process may be provided by analog and/or digital input connections of the system controller 622. The signals for controlling processes are output on the analog and digital output connections of the apparatus 600.

Figure 7:
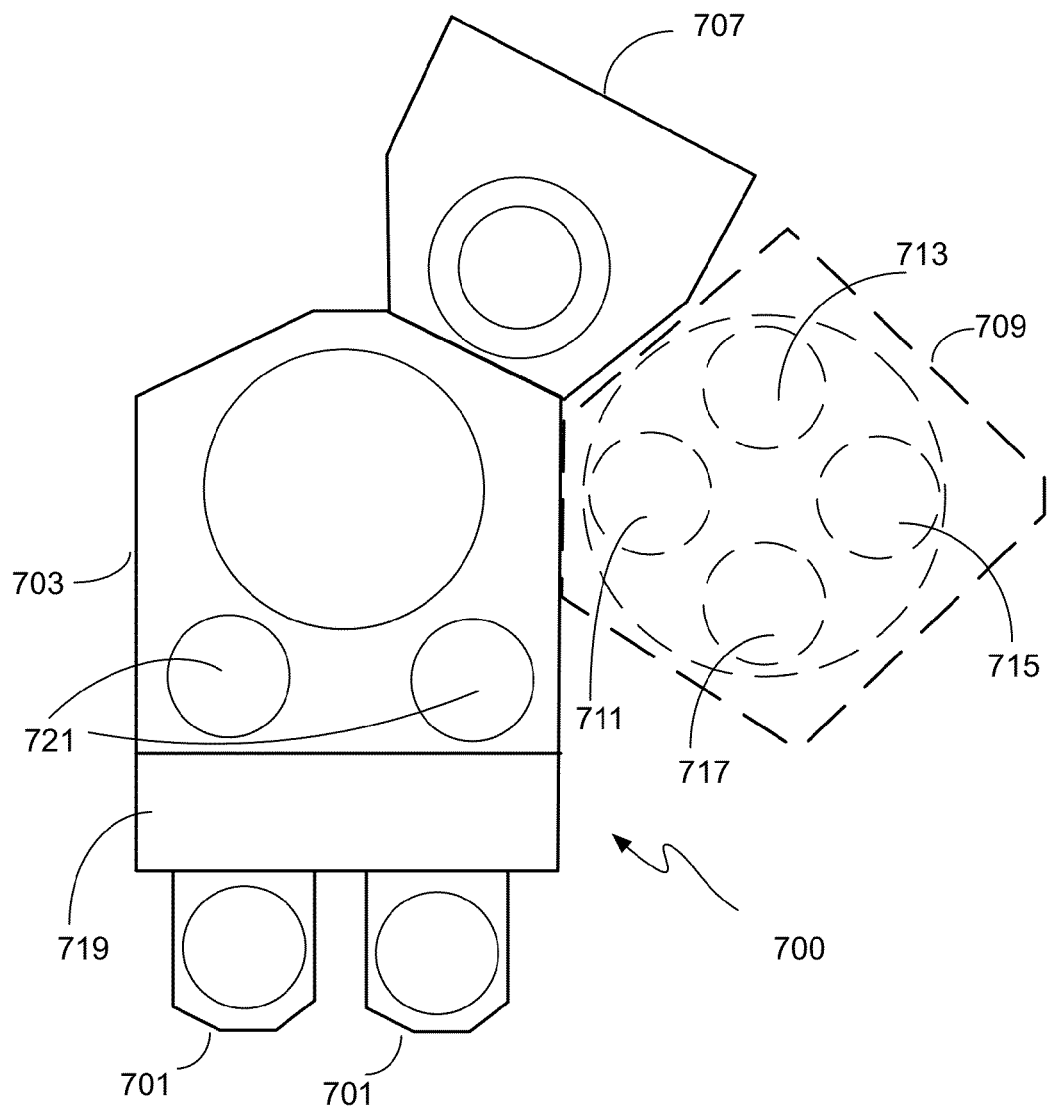
FIG. 7 schematically illustrates a CVD processing system suitable for performing tungsten deposition processes in accordance with certain embodiments disclosed herein.

FIG. 7 schematically illustrates a block diagram of CVD processing system suitable for performing tungsten deposition processes in accordance with various embodiments disclosed herein. The system 700 includes a transfer module 703. The transfer module 703 provides a clean, pressurized environment to minimize the risk of contamination of substrates being processed as they are moved between the various reactor modules. Mounted on the transfer module 703 is a multi-station reactor 709 capable of performing PNL and CVD processes according to various tungsten fill processes disclosed herein. Chamber 709 may include multiple stations 711, 713, 715, and 717 that may sequentially perform these operations. For example, chamber 709 could be configured such that station 711 performs PNL deposition, station 713 performs one or more treatment operations, and stations 715 and 717 perform CVD.

Also mounted on the transfer module 703 may be one or more single or multi-station modules 707 capable of performing plasma or chemical (non-plasma) pre-cleans, horizontal etches, and/or vertical etches. The module may also be used for various other treatments, e.g., post liner tungsten nitride treatments. The system 700 also includes one or more (in this case two) wafer source modules 701 where wafers are stored before and after processing. An atmospheric robot (not shown) in the atmospheric transfer chamber 719 first removes wafers from the source modules 701 to loadlocks 721. A wafer transfer device (generally a robot arm unit) in the transfer module 703 moves the wafers from loadlocks 721 to and among the modules mounted on the transfer module 703.

Figure 8:
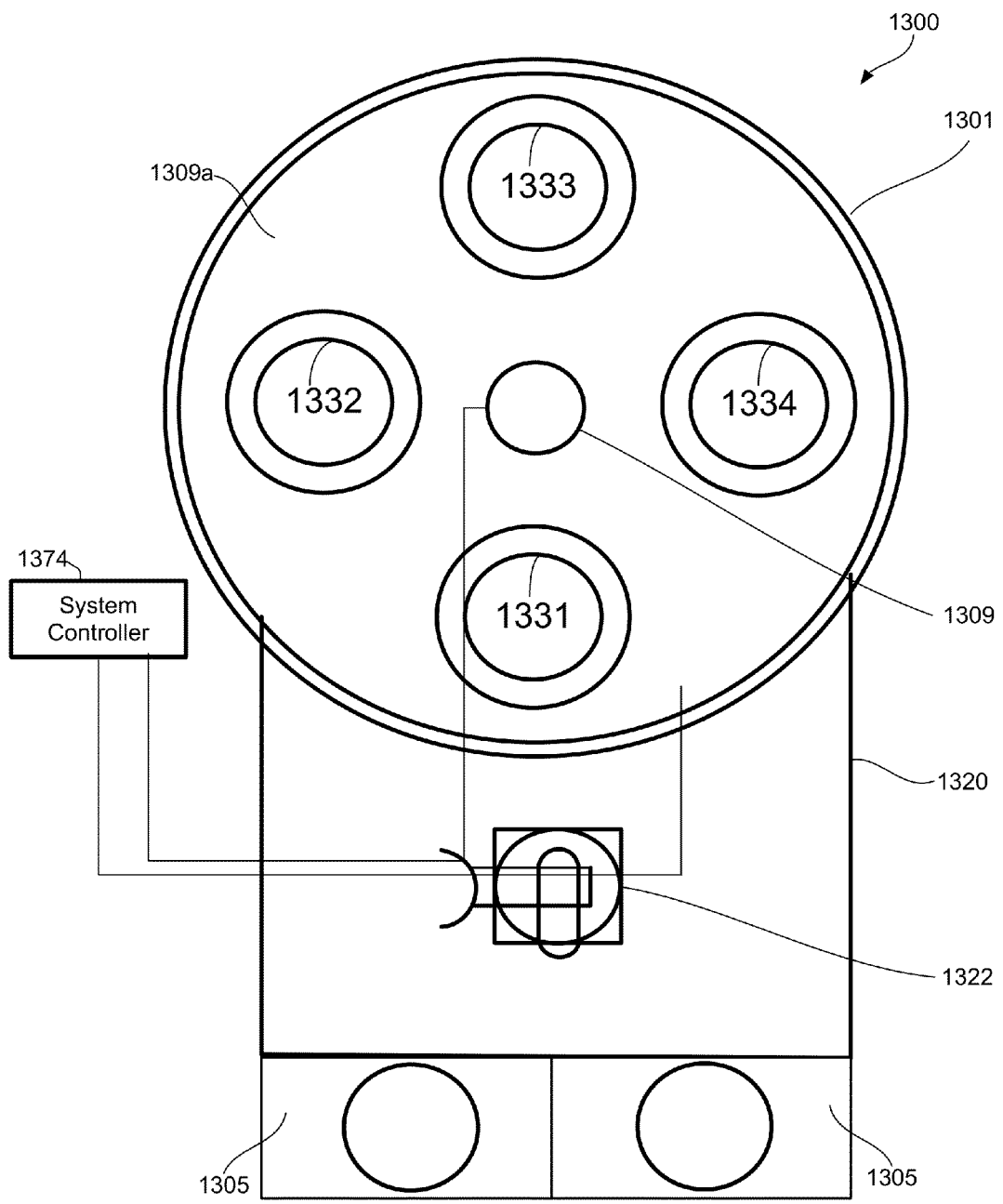
FIG. 8 schematically illustrates a multi-station substrate processing apparatus that may be used to perform certain tungsten deposition and/or etch operations disclosed herein.

FIG. 8 schematically illustrates a multi-station apparatus 1300 that may be used to perform certain tungsten deposition and/or etch operations. The apparatus 1300 includes a processing chamber 1301, which houses a number of stations. In this particular embodiment, the processing chamber 1301 houses four stations, 1331, 1332, 1333, and 1334, but in other embodiments, two or three or more than four stations may be housed in a suitable processing chamber. In this embodiment, there are four wafer carrier rings coinciding with the four stations 1331, 1332, 1333, and 1334 in the figure which serve to hold and rotate the wafers among the four stations. An indexing tool 1309 transfers each wafer via carrier ring from one station to the next by rotating between stations 1331, 1332, 1333, and 1334.

All stations in the multi-station apparatus 1300 with a processing chamber 1301 may be exposed to the same pressure environment controlled by the system controller 1374. Sensors (not shown) may also include a pressure sensor to provide chamber pressure readings. However, each station may have individual temperature conditions or other conditions.

Still referring to FIG. 8, in a deposition process, typically a wafer to be processed is loaded from a cassette through a load-lock 1305 into station 1331. An external robot 1307 may be used to transfer the wafer from the cassette into the load-lock 1305. In the depicted embodiment, there are two separate load-locks 1305. These are typically equipped with wafer transferring devices to move wafer from the load-lock 1305 into the station 1331 and from the station 1334 back into the load-lock 1305 for removal from the processing chamber 1301.

A system controller 1374 can control conditions of the indexing tool 1309, the stations, and the processing chamber 1301, such as the pressure of the chamber. For example, the controller 1374 may move the wafers between stations 1331, 1332, 1333, and 1334.

In some embodiments, particular stations within the processing chamber may be used to perform particular deposition and etch operations of the uniform tungsten fill operations disclosed herein. For instance, tungsten deposition may be performed at one station, such as 1331, vertical etch at another station, such as 1332, horizontal etch at a third station, such as 1333, and finally an additional tungsten deposition operation at yet a fourth station, such as 1334. In other embodiments, one or more of the aforementioned operations may be performed at a single station. Furthermore, multiple stations may be used to perform the same operations in parallel on different semiconductor substrates. For example, if there are four operations and eight stations, pairwise processing of semiconductor substrates may be feasible and/or appropriate.

As another example, if the first station 1331 is used for tungsten deposition, then reducing gases and tungsten-containing gases may be alternately introduced to the surface of the semiconductor substrate at the first station 1331 using an individual gas supply system that creates a localized atmosphere at the substrate surface.

Figure 9:
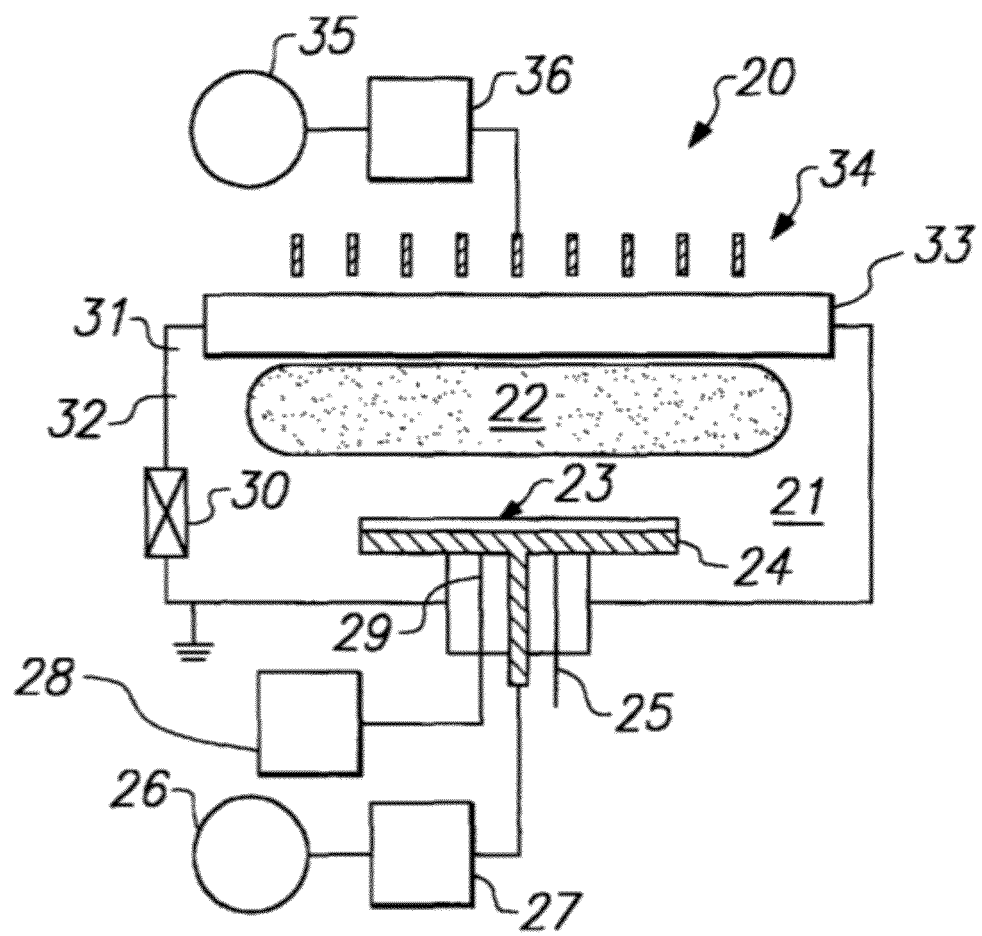
FIG. 9 schematically illustrates an embodiment of an inductively coupled plasma reactor which may be used to generate an in situ plasma employed in certain vertical etch operations disclosed herein.

In some embodiments, an inductively coupled plasma reactor may be used to generate the in situ plasma used in the vertical etch as described above One embodiment of such a reactor is schematically illustrated in FIG. 9. In brief, inductively coupled plasma reactor 20 includes a process chamber 21 in which plasma 22 is generated adjacent substrate 23. The substrate is supported on water cooled substrate support 24 and temperature control of the substrate is achieved by supplying helium gas through conduit 25 to a space between the substrate and the substrate support. The substrate support can include an anodized aluminum electrode, which may be heated, or a ceramic material having a buried electrode therein, the electrode being powered by an RF source 26 and associated circuitry 27 for providing RF matching, etc. The temperature of the substrate during processing thereof is monitored by temperature monitoring equipment 28 attached to temperature probe 29.

In order to provide a vacuum in chamber 21, a pump is connected to outlet port 30 and a pressure control valve can be used to maintain the desired vacuum pressure. Process gases can be supplied into the chamber by supply line or conduits 31, 32 which feed the plasma reagent gases to gas distribution rings extending around the underside of dielectric window 33 or the process gases can be supplied through a dielectric showerhead window. An external ICP coil 34 located outside the chamber in the vicinity of the window is supplied with RF power by RF source 35 and associated circuitry 36 for impedance matching, etc. As is apparent, the external induction coil is substantially planar and generally includes a single conductive element formed into a planar spiral or a series of concentric rings. The planar configuration allows the coil to be readily scaled-up by employing a longer conductive element to increase the coil diameter and therefore accommodate larger substrates or multiple coil arrangements could be used to generate a uniform plasma over a wide area. When a substrate is processed in the chamber, the RF source 35 supplies the coil 34 with inductively-coupled RF power, and the RF source 26 supplies the lower electrode with substrate-biased RF power.

In some embodiments, the inductively-coupled RF power may be generated by RF source 35 at a frequency between about 13 and 60 MHz, while the substrate-biased RF power may be generated by RF source 36 at a frequency between about 400 kHz to 13.5 MHz. In some embodiments, the substrate-biased RF power may have a voltage between about 100 to 1000 volts relative to the substrate. In some embodiments, the substrate-biased RF power may be pulsed by RF source 26 at a pulse rate between about 100 Hz and 2000 Hz and with a duty cycle between about 10% and 90%. In some embodiments, RF source 35 may generate between about 500 and 1900 Watts of inductively-coupled RF power.

As stated above, multiple concentric generating coils may be used to generate a plasma over a wider area. Thus, in some embodiments, inductively-coupled RF power may be generated by a pair of first and second generating coils. In certain such embodiments, the first generating coil may supply inductively-coupled RF power to an inner region of the processing chamber, and the second generating coil may supply inductively-coupled RF power to an outer region of the processing chamber. In some configurations, the total inductively-coupled RF power may be split between the first and second generating coils in a ratio between about 0.1 and 1.5.

A large DC sheath voltage above the surface of a substrate can be provided by supplying RF power to the electrode. RF bias is typically applied to the substrate to direct plasma ions downward towards the base of the high aspect ratio structure on the substrate targeted for vertical etch. In some embodiments, the RF frequency can be selected to be anything above the value necessary to sustain a steady state sheath voltage around the substrate—often a few hundred kHz.

In some embodiments, a system controller (which may include one or more physical or logical controllers) controls some or all of the operations of an etching chamber, a deposition chamber, and/or a multi-module tool including one or more etching modules and/or one or more deposition modules. The system controller may include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the controller or they may be provided over a network. In certain embodiments, the system controller executes system control software.

The system control software may include instructions for controlling the timing of application and/or magnitude of any one or more of the following chamber operational conditions: the mixture and/or composition of gases, chamber pressure, chamber temperature, wafer temperature, the bias applied to the wafer, the frequency and power applied to coils or other plasma generation components, wafer position, wafer movement speed, and other parameters of a particular process performed by the tool. System control software may be configured in any suitable way. For example, various process tool component subroutines or control objects may be written to control operation of the process tool components necessary to carry out various process tool processes. System control software may be coded in any suitable computer readable programming language.

In some embodiments, system control software includes input/output control (IOC) sequencing instructions for controlling the various parameters described above. For example, each phase of a semiconductor fabrication process may include one or more instructions for execution by the system controller. The instructions for setting process conditions for an etching phase may be included in a corresponding etching recipe phase, for example. In some embodiments, the recipe phases may be sequentially arranged, so that all instructions for a process phase are executed concurrently with that process phase. The instructions for setting process conditions for an deposition phase may be included in a corresponding deposition recipe phase.

Other computer software and/or programs may be employed in some embodiments. Examples of programs or sections of programs for this purpose include a substrate positioning program, a process gas composition control program, a pressure control program, a heater control program, and an RF power supply control program.

In some cases, the controllers control gas concentration, wafer movement, and/or the power supplied to the coils and/or electrostatic chuck. In some cases, the controllers control gas concentration, wafer movement, and/or the power supplied to a remote plasma generator.

The controller may control the gas concentration by, for example, opening and closing relevant valves to produce one or more inlet gas streams that provide the necessary reactant(s) at the proper concentration(s). The wafer movement may be controlled by, for example, directing a wafer positioning system to move as desired. The power supplied to the coils and/or chuck and/or remote plasma generator may be controlled to provide particular RF power levels. The controllers may control these or other aspects based on sensor output (e.g., when power, potential, pressure, etc. reach a certain threshold), the timing of an operation (e.g., opening valves at certain times in a process) or based on received instructions from a user.

Photolithography

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or X-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Other Embodiments

Although the foregoing disclosed processes, methods, systems, apparatuses, and compositions have been described in detail within the context of specific embodiments for the purpose of promoting clarity and understanding, it will be apparent to one of ordinary skill in the art that there are many alternative ways of implementing these processes, methods, systems, apparatuses, and compositions which are within the spirit of this disclosure. Accordingly, the embodiments described herein are to be viewed as illustrative of the disclosed inventive concepts rather than restrictively, and are not to be used as an impermissible basis for unduly limiting the scope of any claims eventually directed to the subject matter of this disclosure.

We claim:

1. A method of filling a 3-D structure of a partially manufactured semiconductor substrate with a tungsten-containing material, the 3-D structure comprising sidewalls, a plurality of openings in the sidewalls leading to a plurality of features having a plurality of interior regions fluidically accessible through the openings, the method comprising:
   providing a substrate having the 3-D structure to a processing chamber;
   depositing a first layer of the tungsten-containing material within the 3-D structure such that the first layer partially fills the plurality of interior regions of the 3-D structure;
   etching vertically after depositing the first layer of the tungsten-containing material, the vertical etching comprising removing portions of the first layer from the sidewalls using a first activated etching material without substantially removing portions of the first layer from the plurality of interior regions;
   etching horizontally after depositing the first layer of the tungsten-containing material, the horizontal etching comprising removing portions of the first layer from the plurality of interior regions using a second activated etching material; and
   depositing a second layer of the tungsten-containing material within the 3-D structure after etching vertically and horizontally such that the second layer fills at least a portion of the interior regions left unfilled by the first layer.

2. The method of claim 1, wherein the first activated etching material comprises an ion species and the second activated etching material comprises a neutral species.

3. The method of claim 2, wherein the second activated etching material is generated from conversion of the first activated etching material within the 3-D structure.

4. The method of claim 3, wherein conversion of the first activated etching material to the second activated etching material comprises the ion species of the first activated etching material accepting one or more electrons and converting to the neutral species of the second activated etching material.

5. The method of claim 4, wherein the ion species is generated within the processing chamber through ionization of one or more of $NF_3$, $CF_4$, $CHF_3$, $CH_2F_2$, and $CH_3F$.

6. The method of claim 2, wherein:
   the first activated etching material is a plasma comprising an ion species generated within the processing chamber;
   the vertical etching comprises applying an electromagnetic field to the ion species so that a portion of the ions are directed towards the bottom of the 3-D structure; and
   the second activated etching material is a plasma comprising a free radical species generated remotely from the processing chamber and introduced into the processing chamber.

7. The method of claim 6, wherein:
   the ion species comprises fluorine; and
   the free radical species comprises fluorine.

8. The method of claim 1, wherein at least a portion of the plurality of features are stacked in substantially vertical alignment with one another.

9. The method of claim 8, wherein the structure has 64 or more vertically stacked features in vertical alignment with one another.

10. The method of claim 1, wherein the partially manufactured semiconductor substrate further comprises an outer layer susceptible to tungsten deposition and upon which the first layer of tungsten-containing material is deposited, and wherein the vertical etching removes the outer layer in at least portions of the sidewalls of the 3-D structure such that substantially no tungsten-containing material is deposited upon these portions during the subsequent deposition of the second layer of tungsten-containing material.

11. The method of claim 10, wherein the outer layer susceptible to tungsten deposition comprises a metal nitride.

12. The method of claim 1, wherein the substrate having the 3-D structure further includes a plurality of polysilicon pillars which partially inhibit the fluidic accessibility of the plurality of interior regions through the plurality of openings.

13. The method of claim 1, further comprising:
   providing a polymer precursor to the processing chamber; and
   forming a protective layer via polymerization of the polymer precursor over portions of the 3-D structure which attenuates the extent to which these portions are etched in the vertical etching.

14. The method of claim 13, wherein:
   the polymer precursor is selected from: $CF_4$, $CHF_3$, $CH_2F_2$, and $CH_3F$; and
   providing the polymer precursor comprises flowing the polymer precursor into the processing chamber at a flow rate between about 30 to 40 sccm.

15. The method of claim 1, further comprising providing the first activated etching material to the processing chamber by flowing one or more of $NF_3$, $CF_4$, $CHF_3$, $CH_2F_2$, and $CH_3F$ into the processing chamber at a flow rate between about 100 and 700 sccm and ionizing it therein.

16. The method of claim 1, wherein the vertical etching is performed with the processing chamber maintained at:
   a temperature between about 10 and 120° C.; and
   a pressure between about 50 and 90 mTorr
while removing portions of the first layer of tungsten-containing material.

17. The method of claim 1, wherein the horizontal etching is performed with the processing chamber maintained at:
   a temperature between about 10 and 120° C.; and
   a pressure of less than about 5 mTorr
while removing portions of the first layer of tungsten-containing material.

18. The method of claim 1, wherein:
   the first activated etching material is a plasma comprising one or more ion species generated within the processing chamber; and
   the plasma is an inductively-coupled plasma generated and maintained by inductively-coupled RF power having a frequency between about 13 and 60 MHz while also generated and maintained by substrate-biased RF power having a frequency between about 400 kHz and 14 MHz.

19. The method of claim 18, wherein the substrate-biased RF power has a voltage between about 100 and 500 Volts relative to the substrate.

20. The method of claim 19, wherein the substrate-biased RF power is pulsed at a rate of between about 100 Hz and 400 Hz and with a duty cycle between about 10% and 60%.

21. The method of claim 18, wherein the inductively-coupled RF power is between about 500 and 600 Watts.

22. The method of claim 21, wherein the inductively-coupled RF power is generated by generating coils comprising a first generating coil and a second generating coil, the first generating coil supplying inductively-coupled RF power to an outer region of the processing chamber, the second generating coil supplying inductively-coupled RF power to an inner region of the processing chamber, and wherein the total inductively-coupled RF power is split between the first and second generating coils in a ratio between about 0.1 and 1.5.

23. The method of claim 1, wherein the etch-rate corresponding to removal of portions of the first layer of the tungsten-containing material during the horizontal etching is substantially mass-transport limited.

24. The method of claim 1, further comprising:
etching vertically the second layer of tungsten-containing material, the vertical etching comprising removing portions of the second layer from the sidewalls using the first activated etching material without substantially removing portions of the second layer from the plurality of interior regions;
etching horizontally the second layer of tungsten-containing material, the horizontal etching comprising removing portions of the second layer from the plurality of interior regions using the second activated etching material; and
depositing a third layer of the tungsten-containing material within the 3-D structure after horizontally and vertically etching the second layer, such that the third layer fills at least part of the portion of the interior regions left unfilled by the first and second layers.

25. A method of filling a 3-D structure of a partially manufactured semiconductor substrate, the 3-D structure comprising sidewalls, a plurality of openings in the sidewalls leading to a plurality of features having a plurality of interior regions fluidically accessible through the openings, the method comprising:
providing a substrate having the 3-D structure, the 3-D structure already having a first layer of a tungsten-containing material at least partially covering its sidewalls and/or openings in its sidewalls, and partially filling the plurality of interior regions, but with a portion of the plurality of interior regions left unfilled by the first layer;
etching vertically to remove portions of the first layer of the tungsten-containing material from the sidewalls and/or openings in the sidewalls without substantially removing portions of the first layer from the plurality of interior regions;
etching horizontally to remove portions of the first layer of the tungsten-containing material from the plurality of interior regions; and
depositing a second layer of the tungsten-containing material after etching horizontally and vertically.

26. The method of claim 25, wherein the vertical etching utilizes a first activated etching material and the horizontal etching utilizes a second activated etching material generated from conversion of the first activated etching material within the 3-D structure.

27. An apparatus for filling a 3-D structure of a partially manufactured semiconductor substrate with a tungsten-containing material, the 3-D structure comprising sidewalls, a plurality of openings in the sidewalls leading to a plurality of features, the plurality of features having a plurality of interiors fluidically accessible through the plurality of openings, the apparatus comprising:
a processing chamber;
a substrate holder within the processing chamber configured to hold the substrate having the 3-D structure;
one or more gas inlets configured to introduce a tungsten-containing precursor and a reducing agent into the processing chamber;
a power supply configured to generate and maintain an ionized plasma within the processing chamber; and
a controller having instructions in the form of machine readable code for operating the one or more gas inlets and power supply, the controller configured to execute the instructions, the instructions comprising:
instructions for depositing a first layer of the tungsten-containing material within the 3-D structure such that the first layer partially fills the plurality of interior regions of the 3-D structure;
instructions for etching vertically and horizontally after depositing the first layer of the tungsten-containing material, the vertical etching comprising removing portions of the first layer from the sidewalls using a first activated etching material without substantially removing portions of the first layer from the plurality of interior regions, the horizontal etching comprising removing portions of the first layer from the plurality of interior regions using a second activated etching material; and
instructions for depositing a second layer of the tungsten-containing material within the 3-D structure after etching vertically and horizontally such that the second layer fills at least a portion of the interior regions left unfilled by the first layer.

* * * * *